(12) United States Patent
Oroku

(10) Patent No.: US 6,374,836 B1
(45) Date of Patent: Apr. 23, 2002

(54) APPARATUS FOR TREATING PLATE TYPE PART WITH FLUID

(75) Inventor: Noriyuki Oroku, Yokohama (JP)

(73) Assignees: Hitachi, Ltd.; Hitachi Kokusai Electric Inc., both of Tokyo (JP)

( * ) Notice: Subject to any disclaimer, the term of this patent is extended or adjusted under 35 U.S.C. 154(b) by 0 days.

(21) Appl. No.: 09/529,953

(22) PCT Filed: Oct. 21, 1998

(86) PCT No.: PCT/JP98/04768

§ 371 Date: Jun. 14, 2000

§ 102(e) Date: Jun. 14, 2000

(87) PCT Pub. No.: WO99/20407

PCT Pub. Date: Apr. 29, 1999

(30) Foreign Application Priority Data

Oct. 22, 1997 (JP) ............................................. 9-289931

(51) Int. Cl.[7] .......................... H01L 21/34; H01L 21/68; B08B 3/02; B08B 11/02
(52) U.S. Cl. ....................... 134/153; 134/140; 134/148; 134/149; 134/157
(58) Field of Search ................................. 134/140, 148, 134/151, 153, 157, 902

(56) References Cited

U.S. PATENT DOCUMENTS

| | | | | |
|---|---|---|---|---|
| 4,544,446 A | * | 10/1985 | Cady | 134/149 |
| 5,169,408 A | * | 12/1992 | Biggerstaff et al. | 134/144 |
| 5,487,398 A | * | 1/1996 | Ohmi et al. | 134/102.2 |
| 5,584,310 A | * | 12/1996 | Bergman et al. | 134/153 |
| 6,146,469 A | * | 11/2000 | Toshima | 134/21 |

FOREIGN PATENT DOCUMENTS

| | | | | |
|---|---|---|---|---|
| JP | 54 073475 | * | 6/1979 | B08B/3/02 |
| JP | 878368 | | 3/1996 | 134/153 |
| JP | 08 130202 A | * | 5/1996 | H01L/21/304 |
| JP | 09 129587 A | * | 5/1997 | H01L/21/304 |
| JP | 11233474 | | 8/1999 | 134/153 |

* cited by examiner

Primary Examiner—Randy Gulakowski
Assistant Examiner—Joseph Perrin
(74) Attorney, Agent, or Firm—Antonelli, Terry, Stout & Kraus, LLP

(57) ABSTRACT

The apparatus has chuck pins 201 for chucking the wafer 1 and a cylindrical inner wheel 204 and a cylindrical outer wheel 203 to prevent the wafer from tilting or moving when fluid-treating the wafer by rotating it. The upper end of the chuck pin 201 is formed with a chuck groove 201a and a wafer release portion 201b. The lower end of the chuck pin 201 is formed with a gear 201e. The outer circumference of the inner wheel 204 is formed with a gear 205 and the inner circumference of the outer wheel 203 is formed with arc grooves 202. After the wafer 1 is placed on the wafer release portions 201b, the inner wheel 204 is rotated relative to the outer wheel 203 to spin the chuck pins 201 on their own axes to chuck the outer periphery of the wafer 1 with the chuck grooves 201a. Then the outer wheel 203 and the inner wheel 204 are rotated together to revolve the chuck pins 201 around their center, causing the wafer 1 chucked by the chuck pins 201 to rotate.

10 Claims, 22 Drawing Sheets

APPARATUS FOR TREATING PLATE TYPE PART WITH FLUID

FIELD OF TECHNOLOGY

The present invention relates to a fluid-treatment apparatus for treating with a fluid thin plate-like parts, such as semiconductor wafers, magnetic recording disk media, liquid crystal display panels and cathode ray tube shadow masks.

BACKGROUND TECHNOLOGY

Conventional apparatus that wash plate-like parts such as silicon wafers in a fluid-treatment process include one disclosed in Japanese Patent Laid-Open No. 8-130202.

This cleaning apparatus has an upper cleaning plate (or upper fluid-treatment plate) opposing the top surface of a wafer, a lower cleaning plate (or lower fluid-treatment plate) opposing the bottom surface of the wafer, and a cylindrical wafer holder with its inner diameter equal to an outer diameter of the wafer. The wafer is held horizontally with the outer circumference of the wafer in contact with the inner circumference of the wafer holder. The upper cleaning plate and the lower cleaning plate are arranged parallel to the top and bottom surfaces of the wafer and spray a cleaning liquid onto the wafer's top and bottom surfaces. As the wafer holder rotates, the wafer held by it is also rotated along with the wafer holder.

The cleaning liquid ejected from the center of the upper cleaning plate passes between the upper cleaning plate and the wafer top surface before being discharged from between the outer periphery of the upper cleaning plate and the outer periphery of the wafer top surface. A cleaning liquid ejected from the center of the lower cleaning plate passes-between the lower cleaning plate and the wafer bottom surface before being discharged from between the outer periphery of the lower cleaning plate and the outer periphery of the wafer bottom surface. The cleaning liquids flowing between the upper cleaning plate and the wafer top surface and between the lower cleaning plate and the wafer bottom surface generate pressures in respective spaces according to the Bernoulli theorem. When the wafer is washed, the pressure developed between the upper cleaning plate and the wafer top surface and the pressure developed between the lower cleaning plate and the wafer bottom surface are subtly balanced.

Though not described in the Japanese Patent Laid-Open No. 8-130202, this conventional technology is considered to have a cover enclosing the upper and lower cleaning plates and the entire wafer holder to prevent the cleaning liquid flowing out of the outer periphery of the wafer from being scattered around.

Such a conventional technology, however, has a drawback that because the wafer is held in the wafer holder only through a frictional force between the wafer and the inner circumferential surface of the wafer holder with which the wafer is in contact, if the balance between the two pressures, one generated between the upper cleaning plate and the wafer top surface and one generated between the lower cleaning plate and the wafer bottom surface, is lost even slightly, the wafer is shifted relatively easily from the wafer holder, causing a part of the rotating wafer to contact the cleaning plates, damaging or smearing the wafer.

Possible causes for breaking the pressure balance include, for example, a wafer being slightly tipped when it is mounted on the wafer holder. In such a case, the flow passage of the cleaning liquid may narrow at one part increasing the flow velocity and, at another part, widen reducing the flow velocity. The flow velocity difference will break the pressure balance. The pressure balance may also collapse when the amounts of cleaning liquid supplied from the upper and lower cleaning plates change. Once the pressure balance is lost, the wafer inclines further, which in turn aggravates the pressure imbalance, eventually resulting in a part of the wafer contacting the cleaning plate. Particularly when a gas is used as the working fluid, because the gas has a lower viscosity and a smaller specific gravity than a liquid, the wafer can very easily incline.

Further, in the conventional technology the cleaning liquid that has been thrown out of the outer periphery of the cleaning plates (hereinafter referred to as waste liquid) stays inside the cover as mist. When, after the wafer cleaning is finished, the cover and the upper cleaning plate are removed to take the wafer out, the waste liquid mist staying inside the cover adheres to the cleaned wafer, contaminating it.

It is therefore a first object of the present invention to provide a fluid-treatment apparatus that can firmly hold a rotating plate-like part to prevent its contact with other members thereby protecting it against being damaged or contaminated.

A second object of the present invention is to provide a fluid-treatment apparatus that can prevent a waste liquid from being scattered around and the plate-like part from being contaminated with the waste liquid.

DISCLOSURE OF THE INVENTION

A first fluid-treatment apparatus of the present invention to achieve the first object described above is characterized by: a plurality of chuck members each having a chuck groove into which an outer periphery of the plate-like part fits, the chuck members being spun on their own axes to assume two states, one of the two states being a chuck state in which the outer periphery of the plate-like part fits in the chuck grooves of the chuck members, the other being a chuck wait state in which the outer periphery of the plate-like part is disengaged from the chuck grooves; a chuck member spin mechanism to spin the plurality of chuck members on their own axes to bring all the chuck members as one piece into the chuck state and the chuck wait state; and a chuck member revolution mechanism to revolve the plurality of chuck members as one piece about an axis to spin the plate-like part chucked by the plurality of chuck members on its own axis.

A second fluid-treatment apparatus to achieve the first object is characterized by the first fluid-treatment apparatus which further includes a chuck member moving mechanism to move the plurality of chuck members in a direction parallel to a revolving axis of the plurality of chuck members.

A third fluid-treatment-apparatus to achieve the first object is characterized by the first fluid-treatment apparatus which further includes: an inner wheel formed cylindrical and having as its center the revolution axis of the plurality of chuck members; an outer wheel formed cylindrical and having as its center the revolution axis, the outer wheel having an inner diameter larger than an outer diameter of the inner wheel; a relative rotation means to rotate the inner wheel relative to the outer wheel about the revolution axis; and an integral rotation means to rotate the outer wheel and the inner wheel together about the revolution axis; wherein the plurality of chuck members engage the outer wheel and the inner wheel so that they spin on their own axes by the relative rotation between the outer wheel and the inner wheel and revolve about a center by the integral rotation of the outer wheel and the inner wheel; wherein the chuck member spin mechanism comprises the inner wheel, the outer wheel and the relative rotation means; wherein the chuck member revolution mechanism comprises the inner wheel, the outer wheel and the integral rotation means.

A fourth fluid-treatment apparatus to achieve the first object is characterized by the third fluid-treatment apparatus, wherein one of the inner wheel and the outer wheel is disposed to be movable in a direction parallel to the revolution axis, the plurality of chuck members engage the one of the wheels so that they cannot move relative to the one wheel in a direction parallel to the revolution axis, and a chuck member moving mechanism is provided to move the one wheel in a direction parallel to the revolution axis.

A fifth fluid-treatment apparatus to achieve the first object is characterized by the third fluid-treatment apparatus, wherein one of the inner wheel and the outer wheel is formed in its circumferential surface with a cam groove, the cam groove extending progressively toward a direction parallel to the revolution axis as it advances around the revolution axis, and the chuck members are each formed with a cam follower portion that fits into the cam groove;

wherein the chuck members are mounted to the other of the inner wheel and the outer wheel so that the chuck members rotate together with the other wheel.

The sixth fluid-treatment apparatus to achieve the first object is characterized by the third or fourth fluid-treatment apparatus, wherein the chuck members have a gear formed on each of their surfaces around their spin axes; wherein the outer wheel has formed in its inner circumferential surface arc grooves each of which can accommodate a part of the gear of each of the chuck members; wherein the inner wheel has formed in its outer circumferential surface around its revolution axis a gear engageable with the gear of the chick members.

A seventh fluid-treatment apparatus to achieve the first object is characterized by the third or fourth fluid-treatment apparatus, wherein a cam pin is secured to the circumferential surface of one of the inner wheel and the outer wheel; wherein the chuck members each have a cam follower portion, the cam follower portion having a groove into which the cam pin can fit and rotation restriction surfaces on both sides of the groove which are formed in a reversed shape of the circumferential surface of the one wheel; wherein the chuck members are mounted to the other of the inner wheel and the outer wheel so that they can be rotated together with the other wheel and can also spin on their own axes.

An eighth fluid-treatment apparatus to achieve the first object is characterized by any one of the third to seventh fluid-treatment apparatus, which further includes: a fluid-treatment plate moving mechanism to move the fluid-treatment plate in a direction parallel to the revolution axis of the plurality of the-chuck members.

A first fluid-treatment apparatus of the present invention to achieve the second object described above is characterized by a fluid-treatment apparatus, in which a fluid-treatment plate faces parallelly at least one of two almost parallel surfaces of a plate-like part and a treatment fluid is ejected from the fluid-treatment plate onto the one surface of the plate-like part while rotating the plate-like part to fluid-treat the plate-like part, and which comprises: an enclosure member enclosing the outer periphery of the plate-like part and the outer periphery of the fluid-treatment plate to receive the treatment fluid injected between the plate-like part and the fluid-treatment plate and discharged from between the outer periphery of the plate-like part and the outer periphery of the fluid-treatment plate; a treatment fluid recovery line to introduce the treatment fluid remaining in the enclosure member to a target location; a gas-liquid separator having a liquid outlet, a gas outlet and a waste liquid inlet, the waste liquid inlet being connected to the treatment fluid recovery line; and a suction means connected to the gas outlet of the gas-liquid separator to evacuate by suction the interiors of the gas-liquid separator, the treatment fluid recovery line and the enclosure member.

A second fluid-treatment apparatus to achieve the second object is characterized by the first fluid-treatment apparatus for realizing the second object wherein the treatment fluid recovery line includes a cylindrical conduit with a rotating axis of the plate-like part as its center and a recovery pipe connected to the cylindrical conduit; wherein the enclosure member has a cross section taken along a plane perpendicular to the rotating axis which is circular about the rotating axis as its center, and the enclosure member rotates about the rotating axis as the plate-like part rotates; wherein the cylindrical conduit has its one end surface formed as a sliding contact surface in sliding contact with the rotating enclosure member and also has a groove extending from the one end surface toward the other end surface; wherein the recovery pipe has its one end connected to the groove of the cylindrical conduit and the other end connected to the waste liquid inlet of the gas-liquid separator.

BEST MODE FOR CARRYING OUT THE INVENTION

The present invention will be described in more detail by referring to the accompanying drawings.

Figure 1:
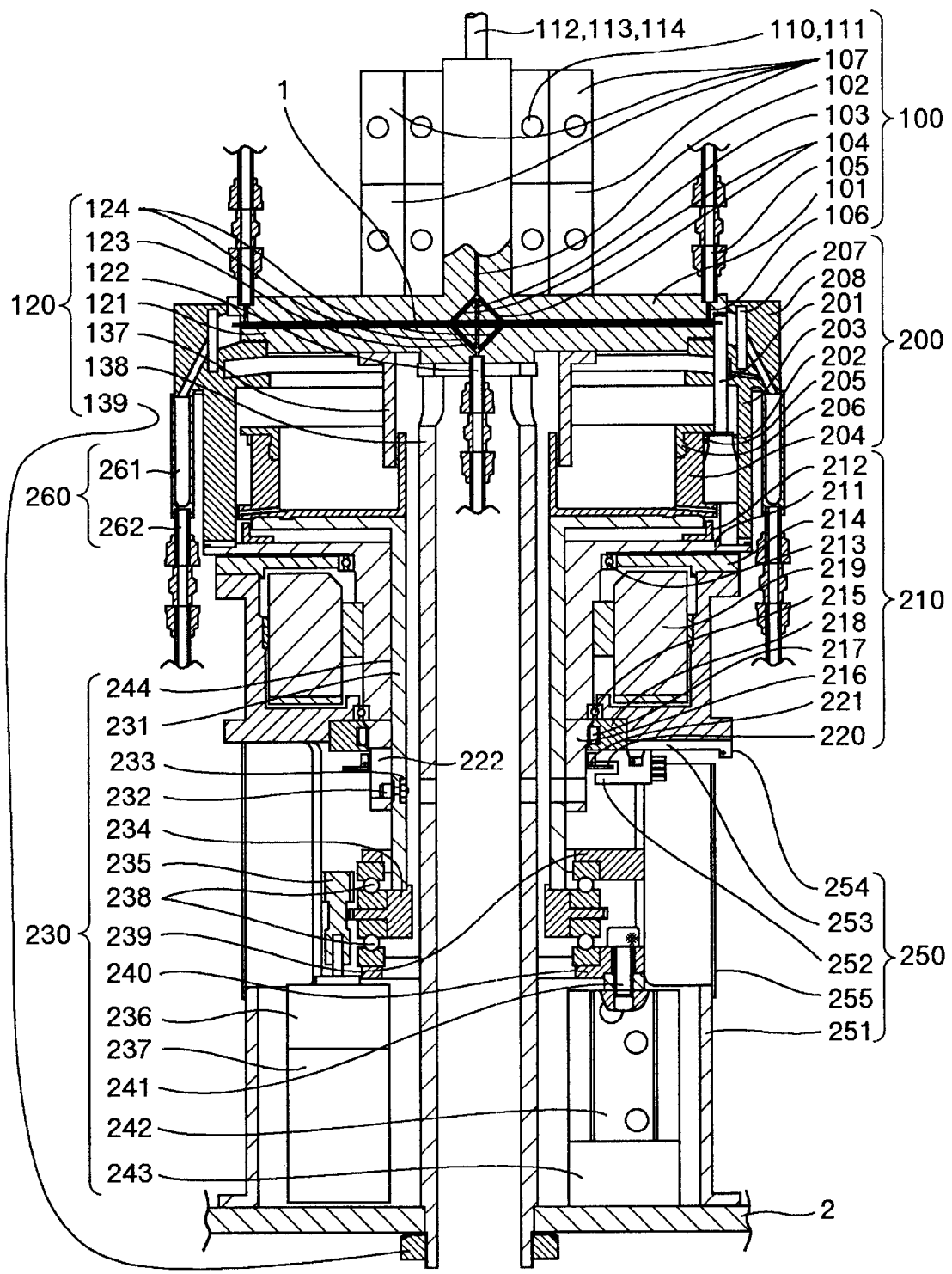
FIG. 1 is a vertical cross section of the cleaning apparatus (in a cleaning state) as one embodiment of the present invention.
Figure 2:
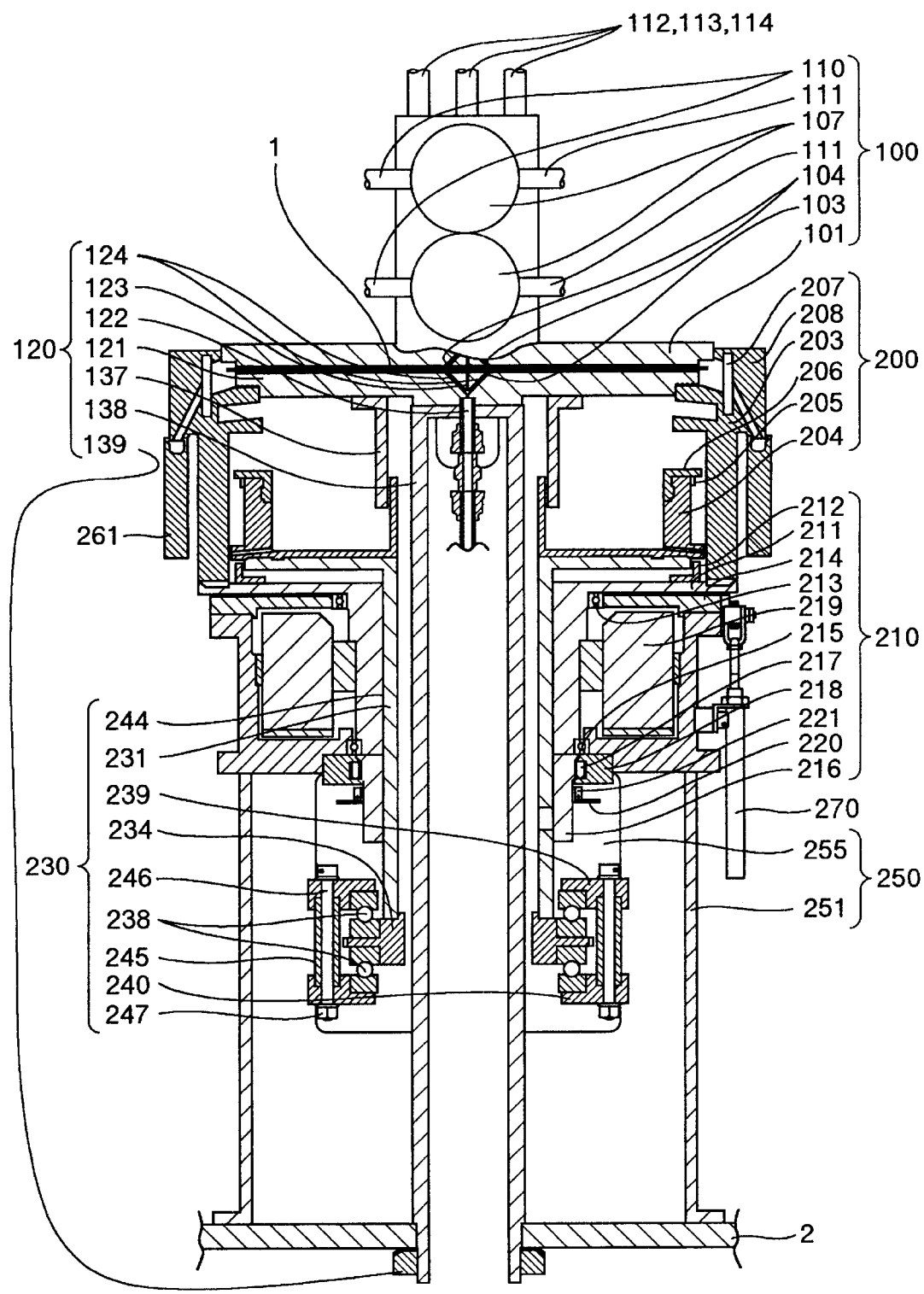
FIG. 2 is a vertical cross section of the cleaning apparatus (in a cleaning state) as one embodiment of the present invention, as seen from another direction.
Figure 3:
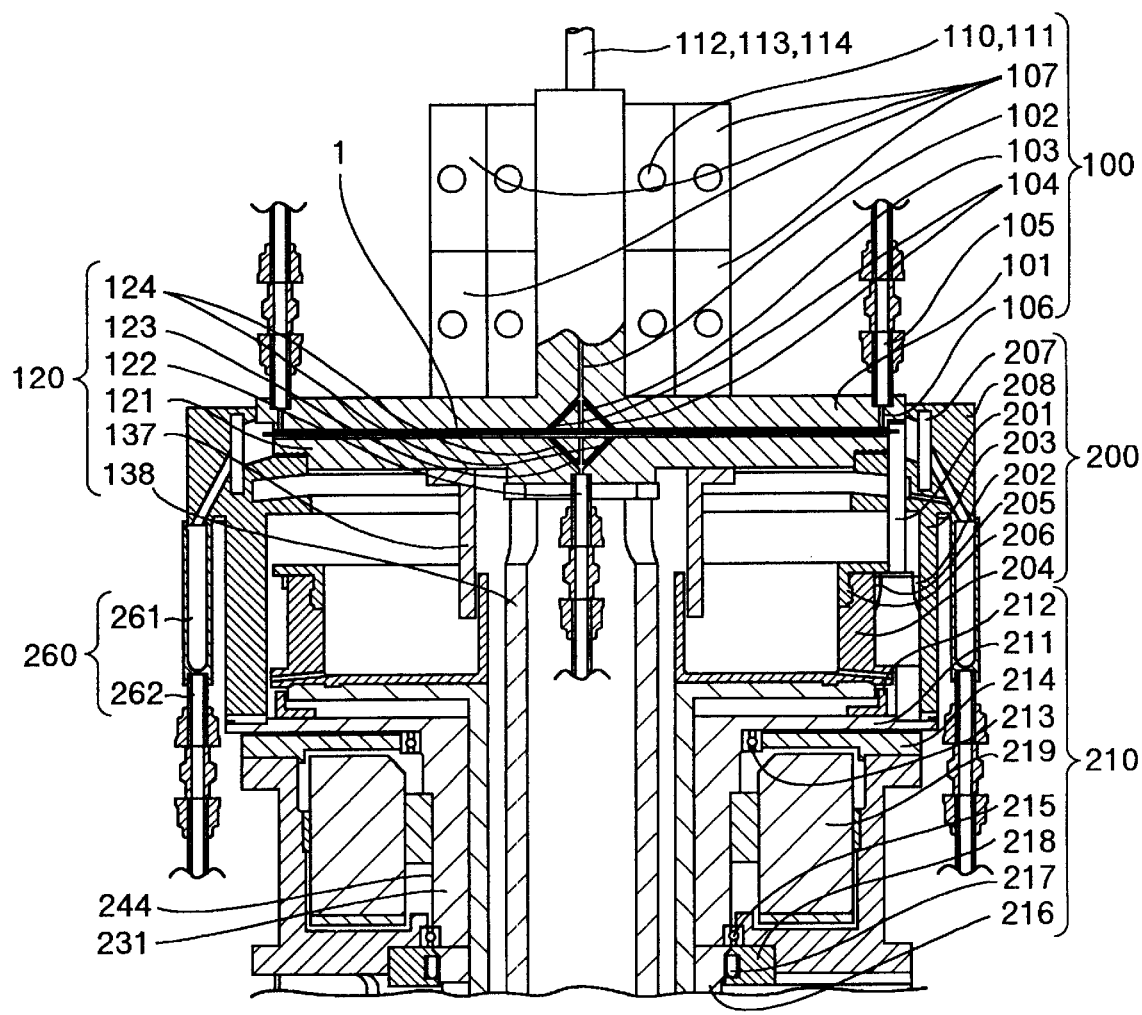
FIG. 3 is an upper vertical cross section of the cleaning apparatus (in a cleaning state) as one embodiment of the present invention.

The cleaning apparatus, as shown in FIGS. 1 and 2, washes a disk-like silicon wafer 1 and comprises an upper cleaning unit 100 for cleaning the top surface of the wafer 1; a lower cleaning unit 120 for cleaning the bottom surface of the wafer 1; a wafer support unit 200 for supporting the wafer 1; an inner wheel drive system 230 for rotating an inner wheel (described later) 204 of the wafer support unit 200; an outer wheel drive system 210 for rotating an outer wheel (described later) 203 of the wafer support unit 200; a chassis unit 250 supporting and enclosing the drive systems 210, 230; an gas-liquid recovery unit 260 for recovering the working fluid applied to the wafer 1; a working fluid supply unit 500 (shown in FIG. 15) for supplying the working fluid to the upper and lower cleaning units 100, 120; an outer wheel stopping unit 270 (shown in FIGS. 13 and 14) for stopping the rotation of the outer wheel 203; and a vertical drive unit 300 (shown in FIG. 16) for driving the upper cleaning unit 100 vertically.

Figure 7:
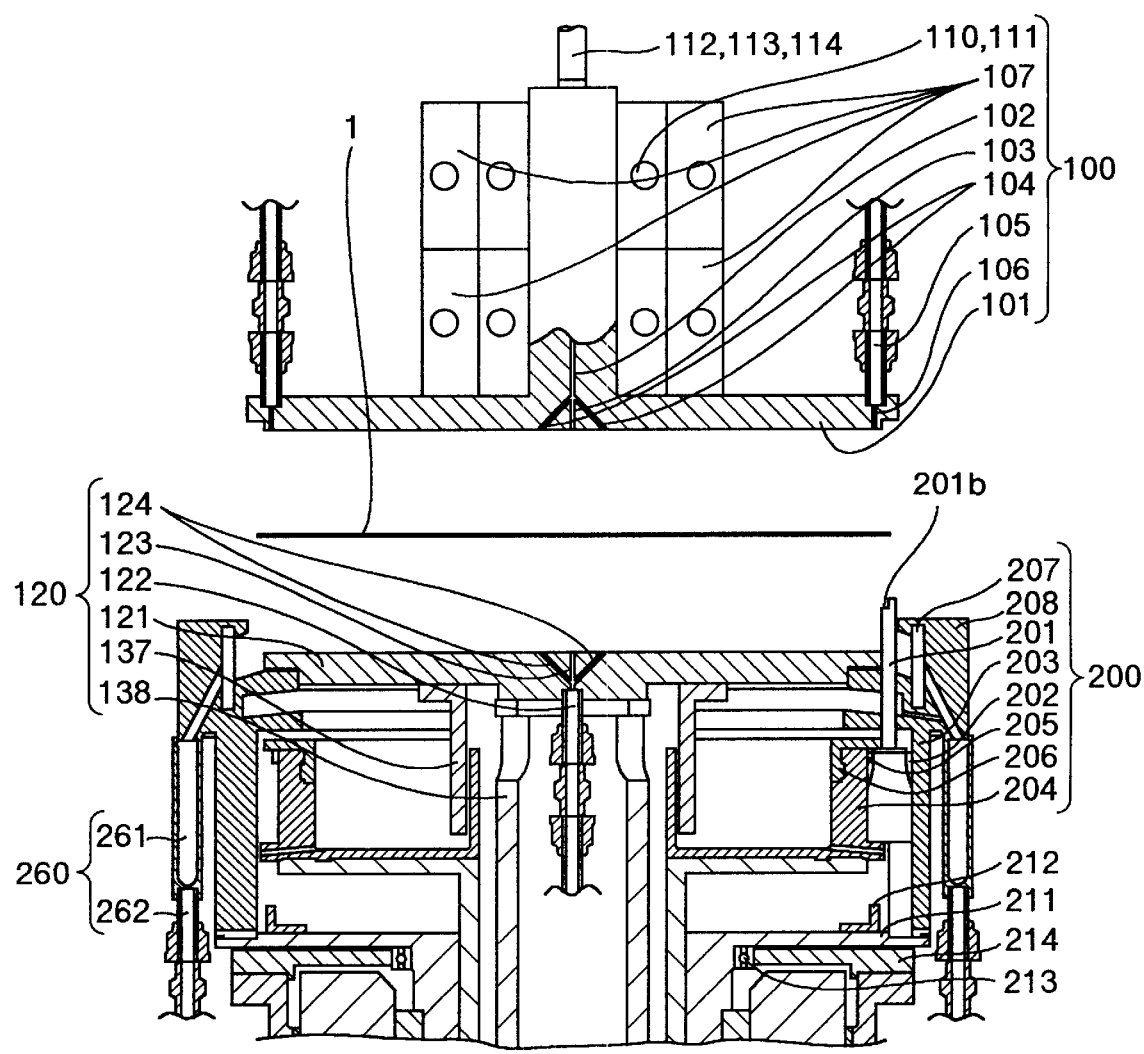
FIG. 7 is an upper vertical cross section of the cleaning apparatus (in a standby state) as one embodiment of the present invention.
Figure 9:
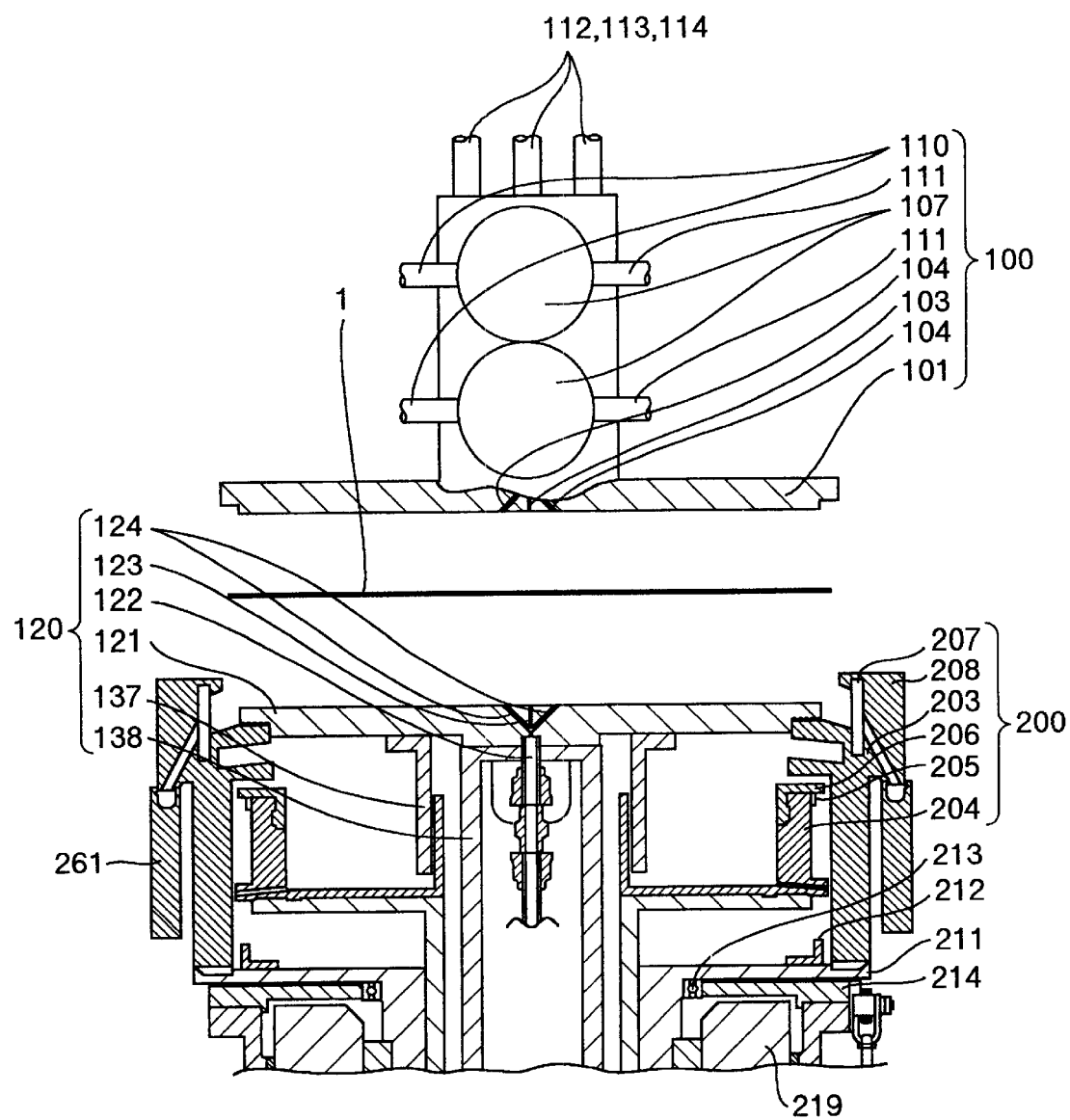
FIG. 9 is an upper vertical cross section of the cleaning apparatus (in a standby state) as one embodiment of the present invention, as seen from another direction.

The upper cleaning unit 100, as shown in FIGS. 7 and 9, has an upper cleaning plate 101 disposed parallel to and facing the top surface of the horizontally supported wafer 1 and an upper valve unit 107 for switching the working fluid ejected onto the top surface of the wafer 1.

Figure 17:
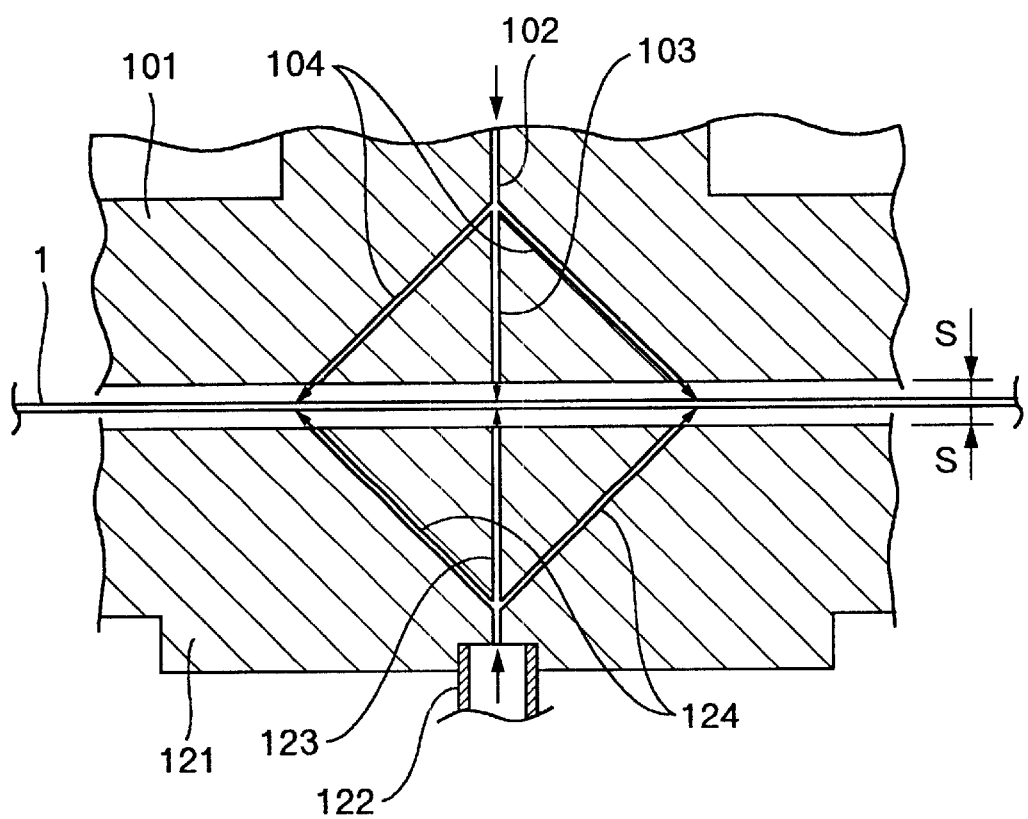
FIG. 17 is a cross section showing an essential portion of the upper and lower cleaning plates as one embodiment of the present invention.

The upper cleaning plate 101 is shaped like a disk with its bottom formed flat. The upper cleaning plate 101, as shown in FIG. 17, is formed with an upper introduction pipe 102 through which the working fluid flows from the upper valve unit 107; an upper main nozzle 103 connected with the upper introduction pipe 102 to eject the working fluid from the center of the bottom surface of the upper cleaning plate 101; upper auxiliary nozzles 104 connected with;the upper introduction pipe 102 to eject the working fluid from portions of the bottom surface of the upper cleaning plate 101 around the upper main nozzle 103; and upper peripheral nozzles 106 (shown in FIG. 7) formed at peripheral portions of the upper cleaning plate 101 and piercing the upper cleaning plate 101 from the top surface to the bottom surface to eject the working fluid. The upper peripheral nozzles 106 are connected with upper peripheral introduction pipes 105. The upper valve unit 107, as shown in FIGS. 7 and 9, is pneumatically driven and formed with upper valve drive air introducing ports 110 and upper valve drive air exhaust ports 111. The upper valve unit 107 selects between chemical liquid, pure water and dry nitrogen and supplies the selected fluid to the upper cleaning plate 101. The upper valve unit 107 is also formed with an upper chemical liquid supply port 112, an upper pure water supply port 113, and an upper dry nitrogen supply port 114.

The lower cleaning unit 120, as shown in FIGS. 7 and 9, has a lower cleaning plate 121 disposed parallel to and facing the bottom surface of the horizontally supported wafer 1 and a support shaft 138 supporting the lower cleaning plate 121.

The lower cleaning plate 121 is shaped like a disk with a flat top surface. As shown in FIG. 17, the center of the bottom surface of the lower cleaning plate 121 is connected with a lower introduction pipe 122 through which the working fluid flows. The lower cleaning plate 121 is formed with a lower main nozzle 123 connected with the lower introduction pipe 122 to eject the working fluid from the center of the top surface of the lower cleaning plate 121 and lower auxiliary nozzles 124 connected to the lower introduction pipe 122 to eject the working fluid from portions of the top surface of the lower cleaning plate 121 around the lower main nozzle 123.

Figure 8:
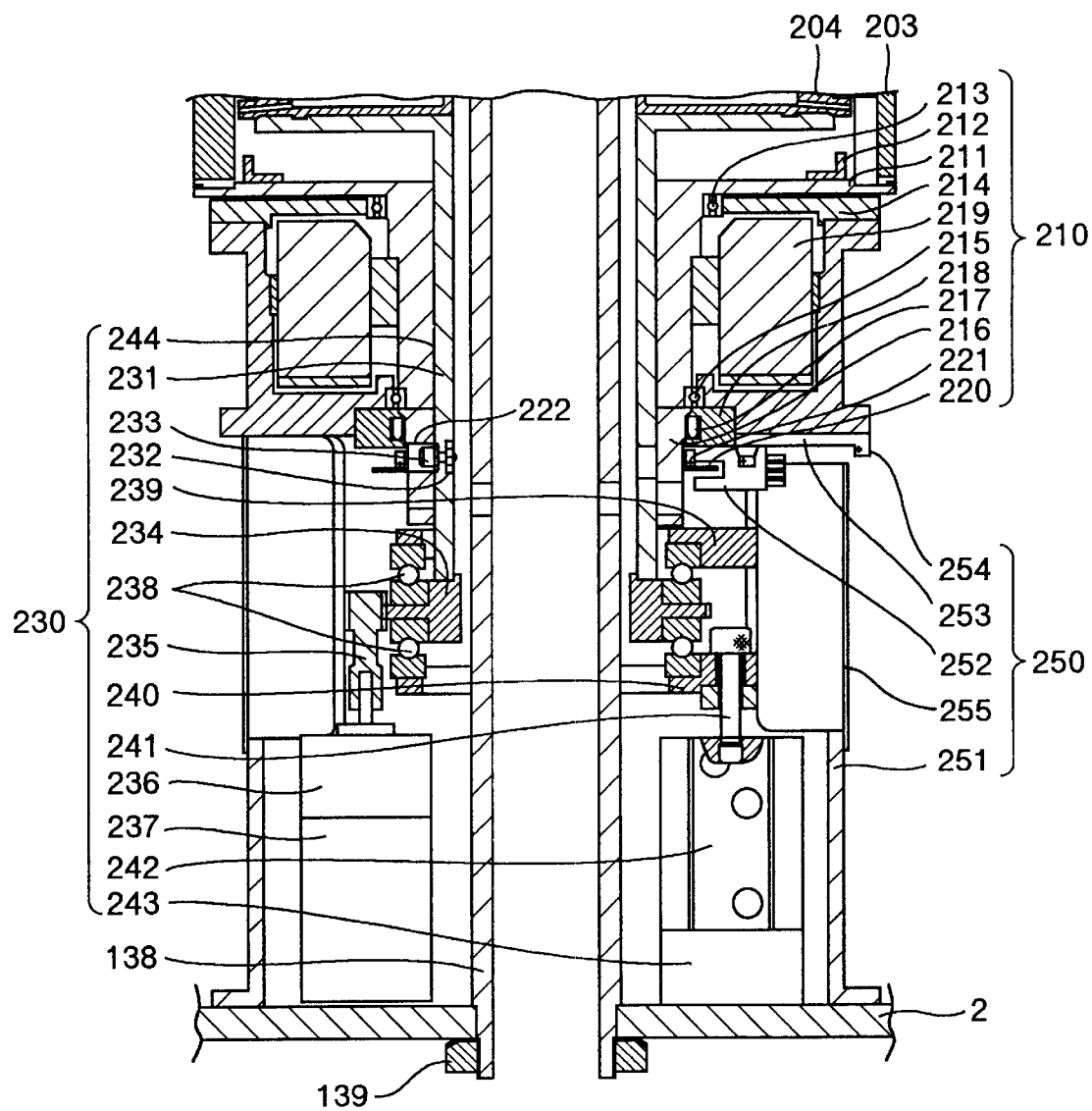
FIG. 8 is a lower vertical cross section of the cleaning apparatus (in a standby state) as one embodiment of the present invention.
Figure 10:
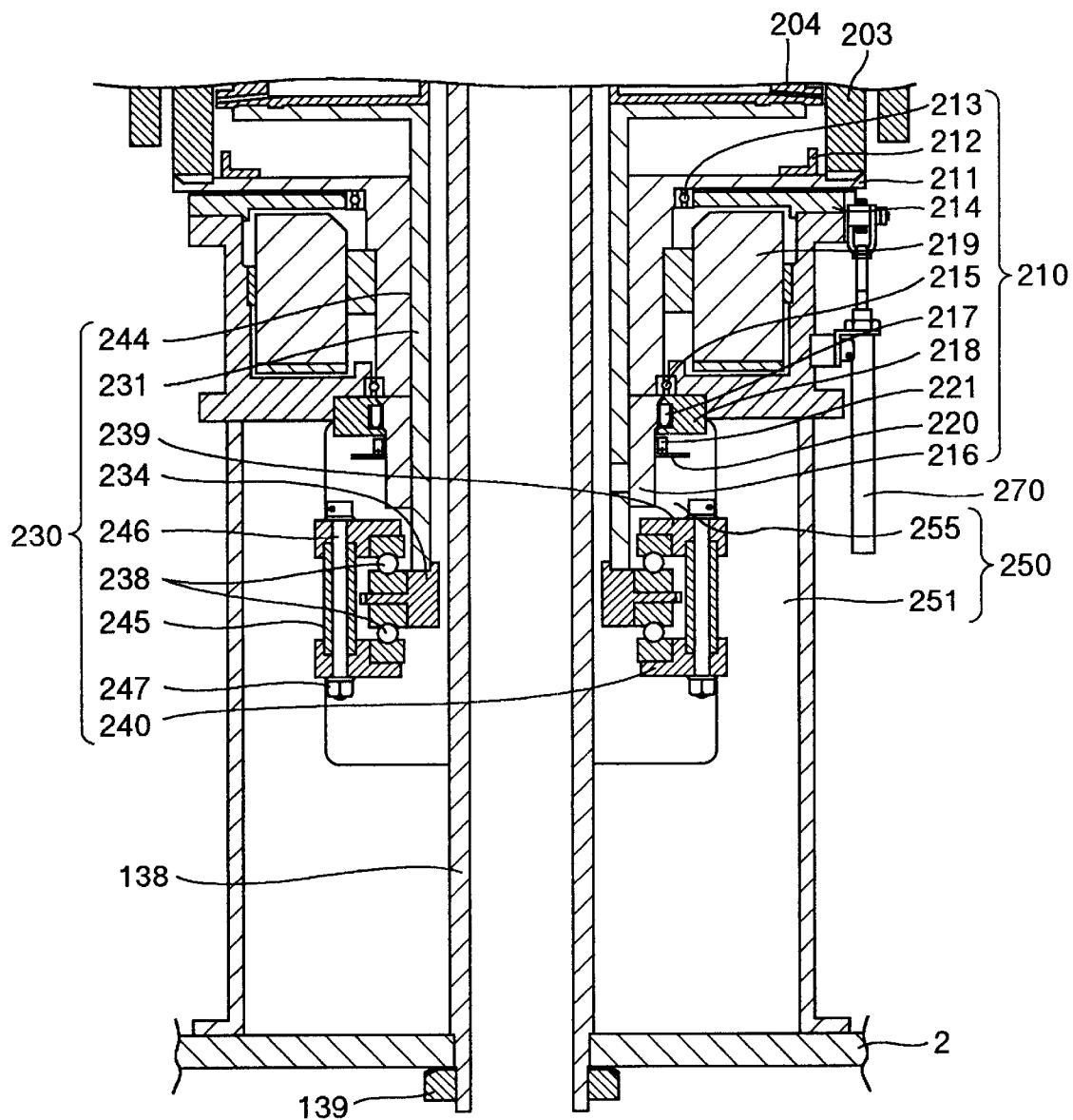
FIG. 10 is a lower vertical cross section of the cleaning apparatus (in a standby state) as one embodiment of the present invention, as seen from another direction.

As shown in FIGS. 7 and 9, the support shaft 138 is a hollow cylinder, the upper end of which is secured to the lower cleaning plate 121. The bottom surface of the lower cleaning plate 121 is rigidly attached with a cylindrical spray containment wall 137 surrounding the upper part of the support shaft 138. Inside the hollow cylindrical support shaft 138 there is the lower introduction pipe 122 connected to the center of the bottom surface of the lower cleaning plate 121. The lower end of the support shaft 138 projects slightly out of a housing 2 and is secured to the housing 2 with a shaft fixing screw 139, as shown in FIGS. 8 and 10.

The upper cleaning unit 100 and the lower cleaning unit 120 are basically formed of a highly chemical resistant material, such as fluorocarbon resin, except that the support shaft 138 and the shaft fixing screw 139 are made of stainless steel. Therefore these cleaning units are not eroded by chemicals such as acid or alkali used in cleaning. Because these units do not support heavy loads, there is no problem if they are made of materials with relatively low rigidity, such as fluorocarbon resin.

The wafer support unit 200, as shown in FIGS. 7 and 9, has a plurality of chuck pins 201 each formed with a chuck groove in which the outer periphery of the wafer 1 fits; an outer wheel 203 for rotating the plurality of the chuck pins 201 about the support shaft 138; an inner wheel 204 for spinning the plurality of the chuck pins 201 on their own axes by a relative rotation between the outer wheel 203 and the inner wheel 204; a pin retainer 206 for preventing the plurality of the chuck pins 201 from vertically moving relative to the inner wheel 204; an almost cylindrical outer wheel hood (enclosure member) 208 disposed around the outer circumference of the upper part of the outer wheel 203; and connecting pins 207 for securing the outer wheel hood 208 to the upper part of the outer wheel 203.

Figure 11:
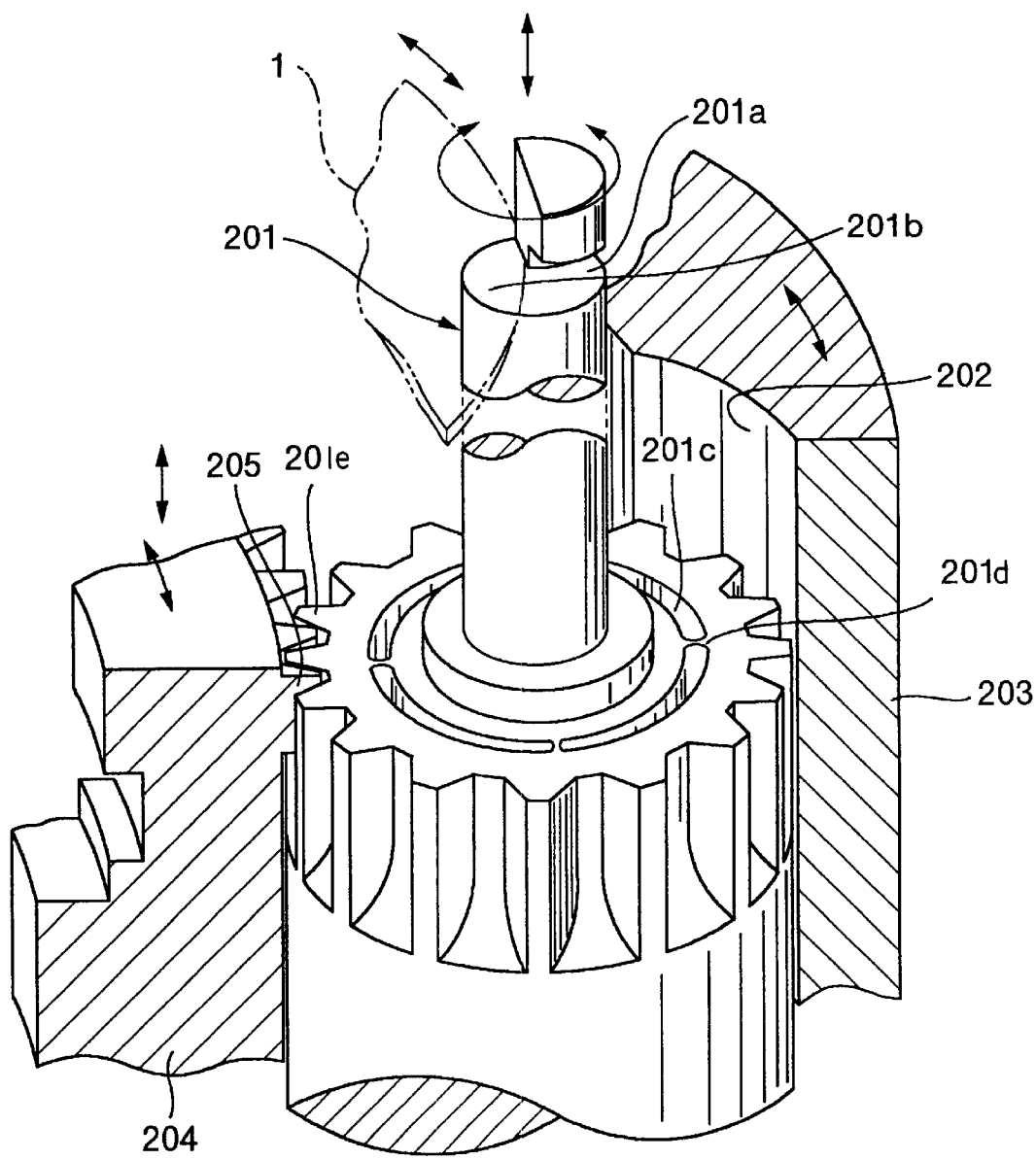
FIG. 11 is a perspective view of a chuck pin as one embodiment of the present invention.

The chuck pins 201, as shown in FIG. 11, has a columnar pin portion and a gear portion formed in the outer circumference of the lower part of the pin portion. The pin portion has its upper end cut away through 180 degrees about its center axis (rotating axis) to form a wafer release portion 201b that provides a simple support for the wafer 1. A part of the upper end of the pin portion that is not cut away is formed with a V-shaped chuck groove 201a which is recessed toward the center axis of the pin portion in a direction almost perpendicular to the center axis. The opening width of the V-shaped chuck groove 201a is larger than the thickness of the wafer 1 so that the wafer 1 can fit into the chuck groove 201a. The gear portion has a gear 201e formed in its outer circumference and also has a plurality of through holes 201c extending vertically and shaped in an arc about the center axis of the pin portion. Plate portions 201d between the plurality of the through holes 201c function as leaf springs which, when an excess torque is applied to the gear 201e, protect the pin portion against the excess torque.

The outer wheel 203 and the inner wheel 204, as shown in FIGS. 7 and 9, are formed cylindrical with the axis of the support shaft 138 (around which the chuck pins 201 revolve) as their center and are rotatable about the support shaft 138. The inner circumferential surface of the outer wheel 203 is formed with an arc groove 202 whose inner diameter is slightly larger than the outer diameter of the gear portion of the chuck pins 201, as shown in FIG. 11, so that a part of the gear portion can be partly accommodated. The outer circumferential surface of the inner wheel 204 is formed with a gear 205 engageable with the gear 201e of the chuck pins 201. That is, the gear portion of the chuck pins 201 is clamped between and engages both of the gear 205 of the inner wheel 204 and the arc groove 202 of the outer wheel 203.

The pin retainer 206 has one part thereof secured to the upper part of the inner wheel 204 and another part in contact with the upper end surface of the gear portion of the chuck pins 201 to keep the chuck pins 201 from moving vertically relative to the inner wheel 204.

The outer wheel hood (enclosure member) 208 is formed almost cylindrical with the support shaft 138 as its center to enclose the outer periphery of the wafer 1 while it is chucked with the chuck pins 201 and cleaned, as described above. The outer wheel hood 208 is secured to the upper part of the outer wheel 203 by the connecting pins 207, as described above, so that as the outer wheel 203 rotates about the support shaft 138, the hood also rotates along with the outer wheel 203.

The inner wheel drive system 230, as shown in FIGS. 8 and 10, has an inner wheel holding hollow shaft 231, to the upper end of which the inner wheel 204 is secured; a cam follower 232 fixed to the inner wheel holding hollow shaft 231 with a fixing screw 233; a geared rotating disk 234 secured to the lower end of the inner wheel holding hollow shaft 231; a clutch gear 235 engaged with and disengaged from the geared rotating disk 234; an inner wheel motor 237 for rotating the clutch gear 235; a reduction gear 236 for reducing the rotation speed of the inner wheel motor 237; thrust bearings 238 rotatably supporting the geared rotating disk 234 from above and below; upper and lower rings 239, 240 vertically holding the thrust bearings 238 between them; a hollow cylindrical spacer 245 for keeping a space between the upper ring 239 and the lower ring 240; a connecting pin 246 passing through the hollow cylindrical spacer 245 and through the upper and lower rings 239, 240; a screw 247 for preventing the upper ring 239 and the lower ring 240 from coming off the connecting pin 246; a vertical drive cylinder 242 for vertically driving the upper ring 239 and the lower ring 240; a fixing screw 241 for connecting a driving end of the vertical drive cylinder 242 to the lower ring 240; and a spacer 243 for adjusting a level at which to mount the vertical drive cylinder 242 to the housing 2.

The inner wheel holding hollow shaft 231 has a pipe portion, whose inner diameter is larger than the outer diameter of the support shaft 138, and a flange portion formed at the upper end of the pipe portion.

The inner wheel 204 is secured to the flange portion. The cam follower 232 is secured to the outer circumference of the pipe portion of the inner wheel holding hollow shaft 231 by the fixing screw 233.

The geared rotating disk 234 is fixed to the lower end of the pipe portion of the inner wheel holding hollow shaft 231.

Figure 4:
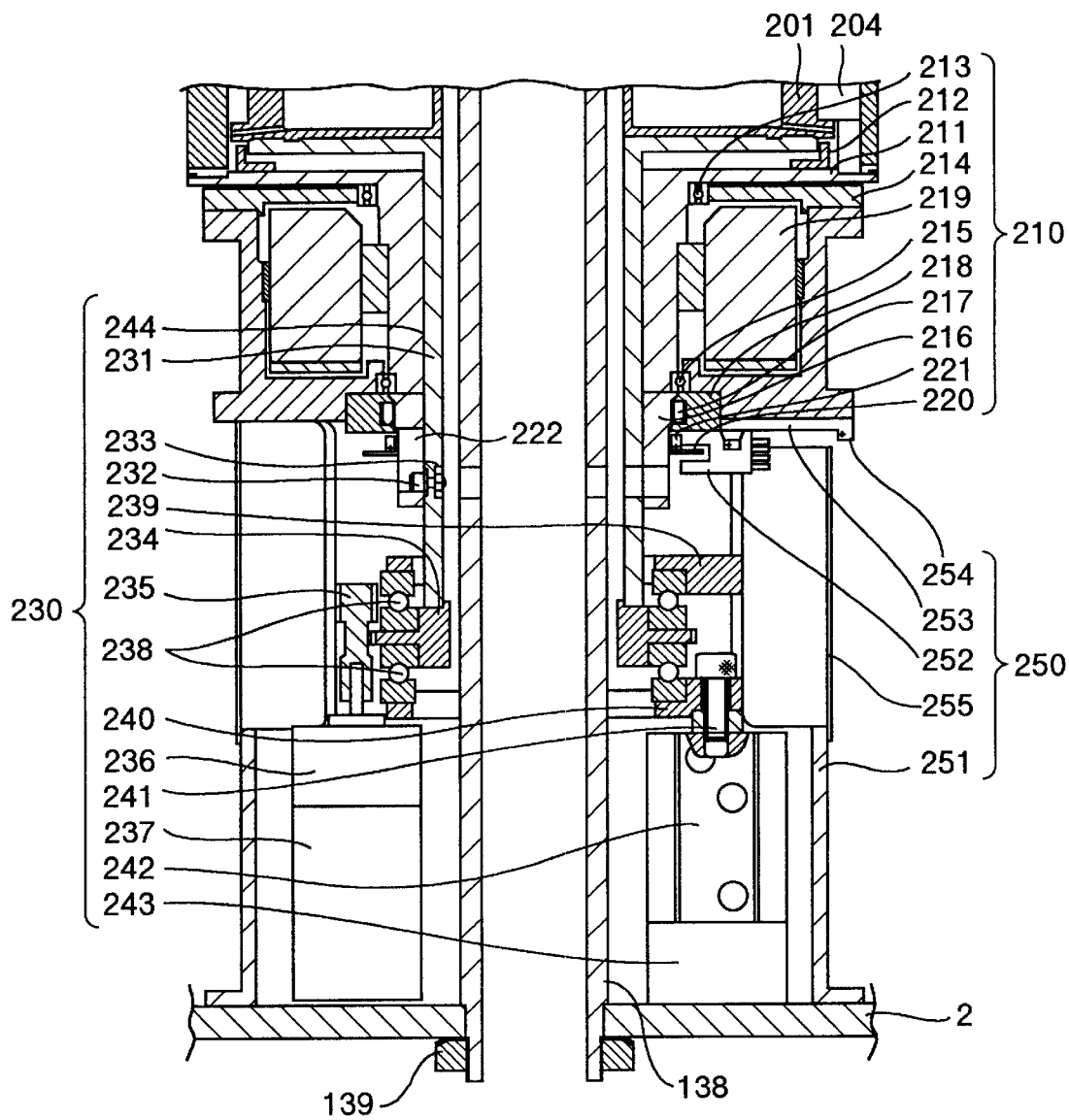
FIG. 4 is a lower vertical cross section of the cleaning apparatus (in a cleaning state) as one embodiment of the present invention.
Figure 5:
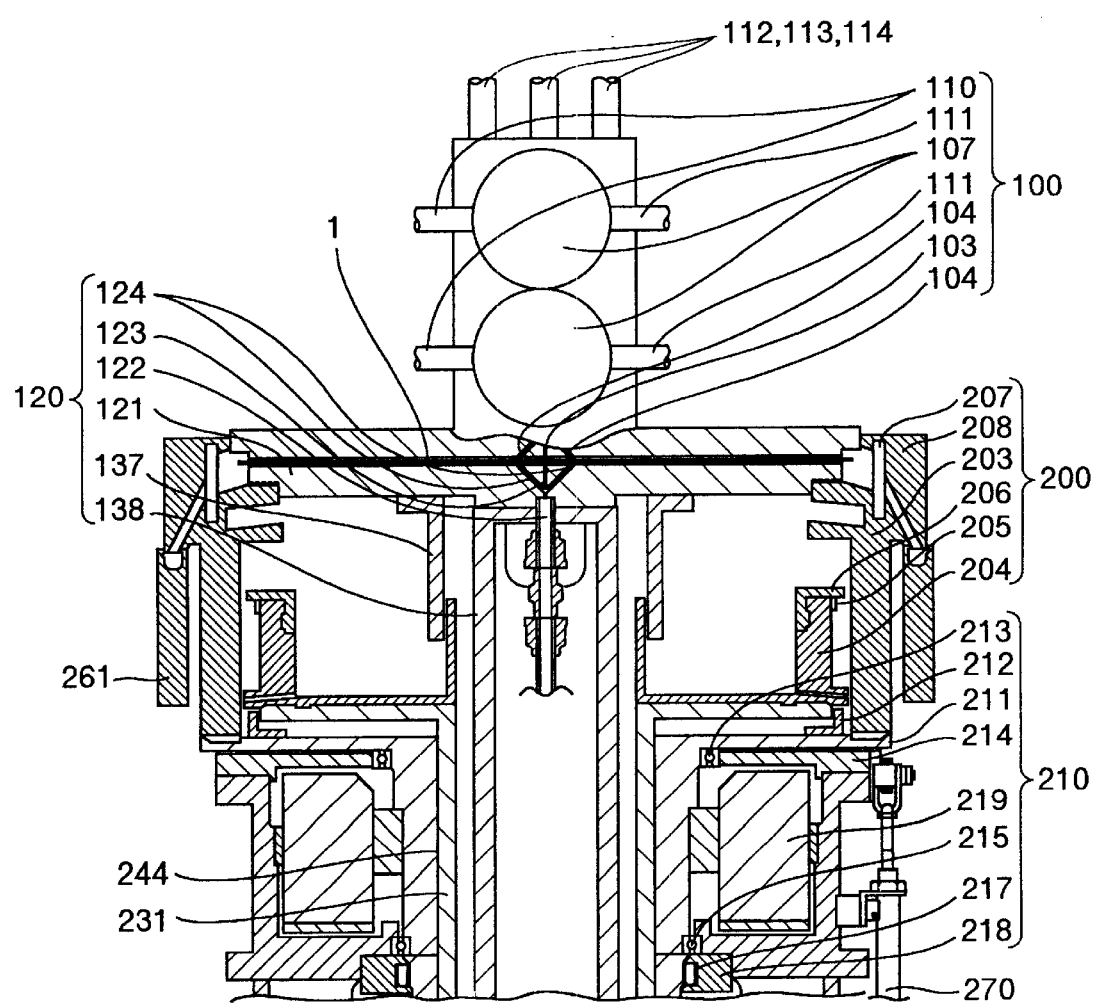
FIG. 5 is an upper vertical cross section of the cleaning apparatus (in a cleaning state) as one embodiment of the present invention, as seen from another direction.
Figure 6:
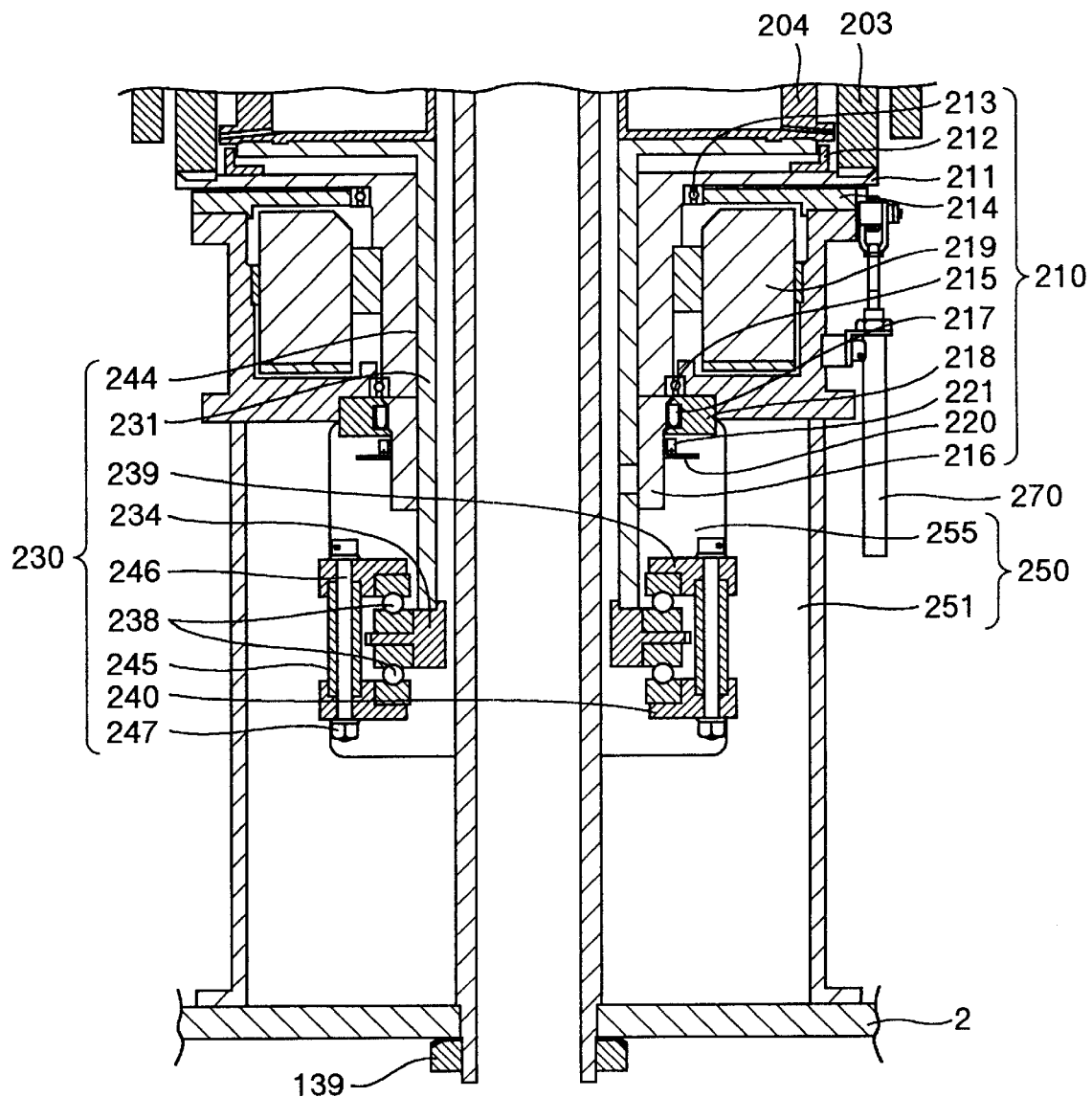
FIG. 6 is a lower vertical cross section of the cleaning apparatus (in a cleaning state) as one embodiment of the present invention, as seen from another direction.

The geared rotating disk 234 is supported by the thrust bearings 238 which are mounted rotatable, and vertically immovable, relative to the upper and lower rings 239, 240. Therefore, when the driving end of the vertical drive cylinder 242 moves vertically, the upper and lower rings 239, 240 connected to the driving end are moved vertically, which in turn drives the geared rotating disk 234 vertically, causing the inner wheel holding hollow shaft 231, the inner wheel 204 and the chuck pins 201 to move vertically. When the geared rotating disk 234 and the inner wheel holding hollow shaft 231 are situated at an upper end position, as shown in FIG. 8, the geared rotating disk 234 and the clutch gear 235 are engaged. When the inner wheel motor 237 is started to rotate the clutch gear 235, the geared rotating disk 234 is also rotated, causing the inner wheel holding hollow shaft 231 and the inner wheel 204 to rotate about the support shaft 138. When the geared rotating disk 234 and the inner wheel holding hollow shaft 231 are situated at a lower end position, the geared rotating disk 234 and the clutch gear 235 are disengaged as shown in FIG. 4. If the clutch gear 235 is rotated by the inner wheel motor 237, the geared rotating disk 234, the inner wheel holding hollow shaft 231 and the inner wheel 204 are not rotated.

The outer wheel drive system 210, as shown in FIGS. 8 and 10, has an outer wheel holding hollow shaft 211, to the upper end of which the outer wheel 203 is secured; an outer wheel fluid stopper 212 secured to the upper end of the outer wheel holding hollow shaft 211 on the inner side of the outer wheel 203; upper and lower bearings 213, 215 supporting the outer wheel holding hollow shaft 211 rotatable about the support shaft 138; an upper bearing holding member 214; a lower bearing inner race holding member 216; a lower bearing outer race holding member 218; a seal 217; an outer wheel rotation hollow motor 219 for rotating the outer wheel holding hollow shaft 211 about the support shaft 138; and a rotating disk 220 formed with a plurality of slits.

The outer wheel holding hollow shaft 211 has a pipe portion whose inner diameter is almost equal to the outer diameter of the inner wheel holding hollow shaft 231 and a flange portion formed at the upper end of the pipe portion. The inner circumferential surface of the pipe portion of the outer wheel holding hollow shaft 211 and the outer circumferential surface of the pipe portion of the inner wheel holding hollow shaft 231 are formed with sliding bearings 244 kept in contact with each other so that the inner wheel holding hollow shaft 231 can smoothly move vertically, and rotate, relative to the outer wheel holding hollow shaft 211. The outer wheel 203 and the outer wheel fluid stopper 212 are secured to the flange portion. The upper bearing 213 has its inner race secured to the upper end of the pipe portion of the outer wheel holding hollow shaft 211 and its outer race secured to the upper bearing holding member 214. The upper bearing holding member 214 is secured to the chassis 251 described later. The lower bearing 215 has its inner race secured to the lower bearing inner race holding member 216 and its outer race secured to the lower bearing outer race holding member 218. The lower bearing inner race holding member 216 is secured to the lower end of the pipe portion of the outer wheel holding hollow shaft 211, and the lower bearing outer race holding member 218 to the chassis 251. The seal 217 is disposed between the lower bearing inner race holding member 216 and the lower bearing outer race holding member 218.

Figure 12:
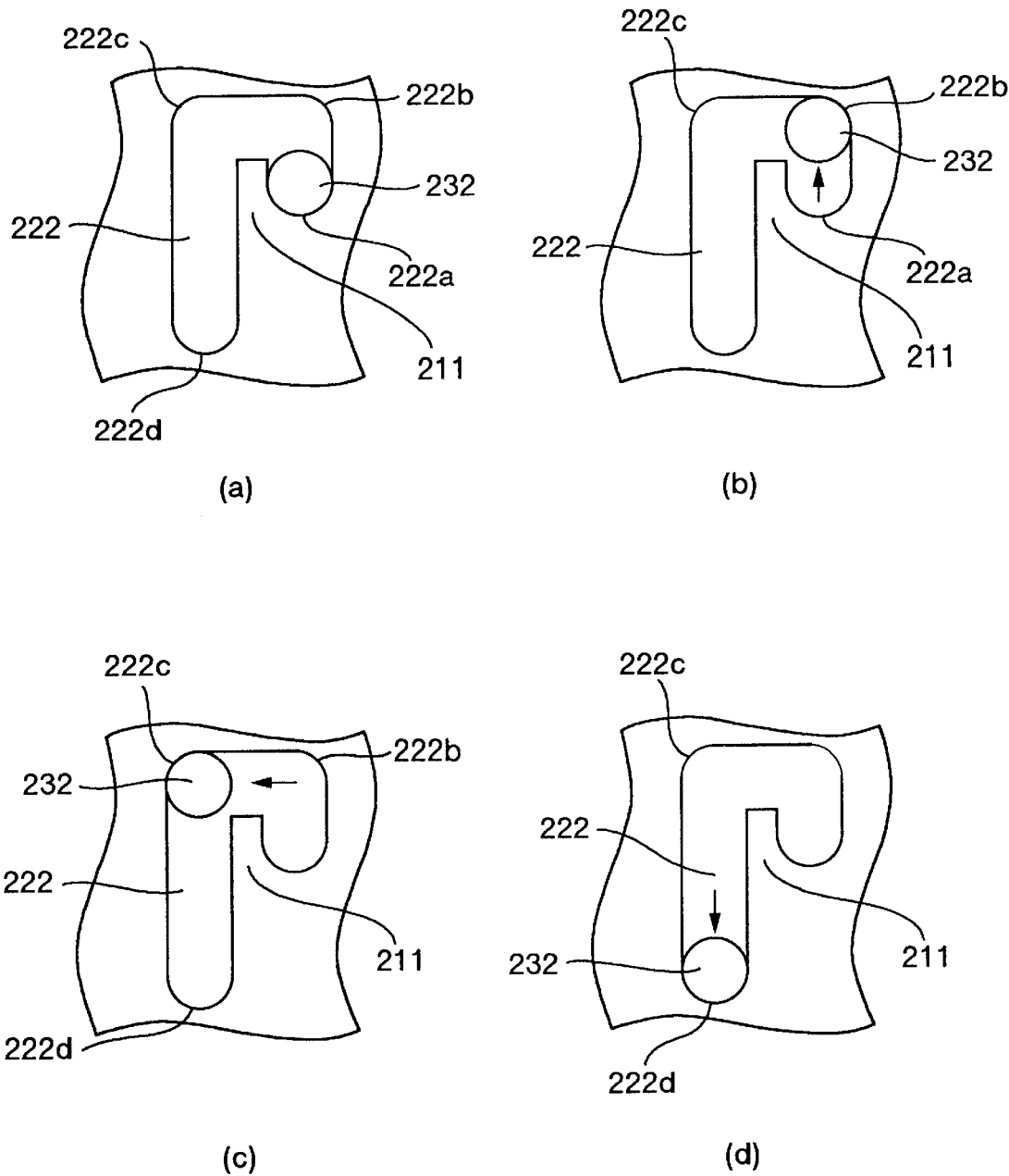
FIG. 12 is explanatory views showing the relation between a cam and a cam follower as one embodiment of the present invention.

The lower bearing inner race holding member 216 secured to the lower end of the pipe portion of the outer wheel holding hollow shaft 211 is formed with a cam groove 222 piercing therethrough from the inner circumference to the outer circumference, into which the cam follower 232 secured to the inner wheel holding hollow shaft 231 slidably fits. The cam groove 222, as shown in FIG. 12(*a*), extends a predetermined distance from a specified position (hereinafter referred to as a standby position) 222*a* to reach an upper end position (wafer chuck wait position) 222*b*, from which it extends horizontally to reach an end position (wafer chuck position) 222*c*, from which it further extends downwardly to a lower end position that constitutes a cleaning position. The vertical length from the wafer chuck position 222*c* to the cleaning position 222*d* is longer than the vertical length from the standby position 222*a* to the wafer chuck wait position 222*b*, and this length represents a vertical stroke of the chuck pins 201. The horizontal length from the wafer chuck wait position 222*b* to the wafer chuck position 222*c* is so determined that the cam follower 232, when it has moved through the cam groove 222 from the wafer chuck wait position 222*b* to the wafer chuck position 222*c*, causes the inner wheel 204 to rotate relative to the outer wheel 203, spinning the chuck pins 201 through 90 degrees. That is, the cam groove 222 and the cam follower 232 combine to limit the relative rotation angle and the vertical relative thrust displacement between the outer wheel 203 and outer wheel holding hollow shaft 211 and the inner wheel 204 and inner wheel holding hollow shaft 231.

Between the upper and lower bearings 213, 215 is disposed an outer wheel rotation hollow motor 219, which has a stator and a rotor. The stator is formed cylindrical, with the support shaft 138 as the center, and has its outer circumferential surface secured to the chassis 251. The rotor is also formed cylindrical, with the support shaft 138 as the center, arranged on the inner side of the stator and secured to the pipe portion of the outer wheel holding hollow shaft 211. The outer wheel 203 secured to the outer wheel holding hollow shaft 211 is driven by the outer wheel rotation hollow motor 219 to rotate about the support shaft 138. The rotating disk 220 is used to detect the rotation angle of the outer wheel 203 as described later.

The chassis unit 250, as shown in FIGS. 8 and 10, is shaped like a cylinder and has a chassis 251 enclosing the vertical drive cylinder 242 and the inner wheel motor 237, three rotation sensors 252 for detecting the rotation angle of the outer wheel 203, a sensor plate 253 shaped like a disk with the support shaft 138 as the center and attached with a plurality of rotation sensors 252 on its underside, fixing screws 254 for fixing the sensor plate 253 to the chassis 251, and a cover 255 for enclosing a side opening of the chassis 251.

The rotation sensors 252 are photo interrupt sensors each having a light emitting element and a light receiving element, with the rotating disk 220 formed with a number of slits disposed between these elements of the three rotation sensors 252, two are A- and B-phase sensors used to detect the rotation based on phase difference and one is a Z-phase sensor for detecting an angle origin. They are secured to the sensor plate 253. The sensor plate 253 is secured to the chassis 251 in a way that allows the adjustment of its position. The rotation sensors 252 detect the rotation angle and speed of the outer wheel holding hollow shaft 211 and the outer wheel 203. Signals from the rotation sensors 252 are sent to a servo control unit, not shown, which servocontrols the outer wheel rotation hollow motor 219.

Figure 16:
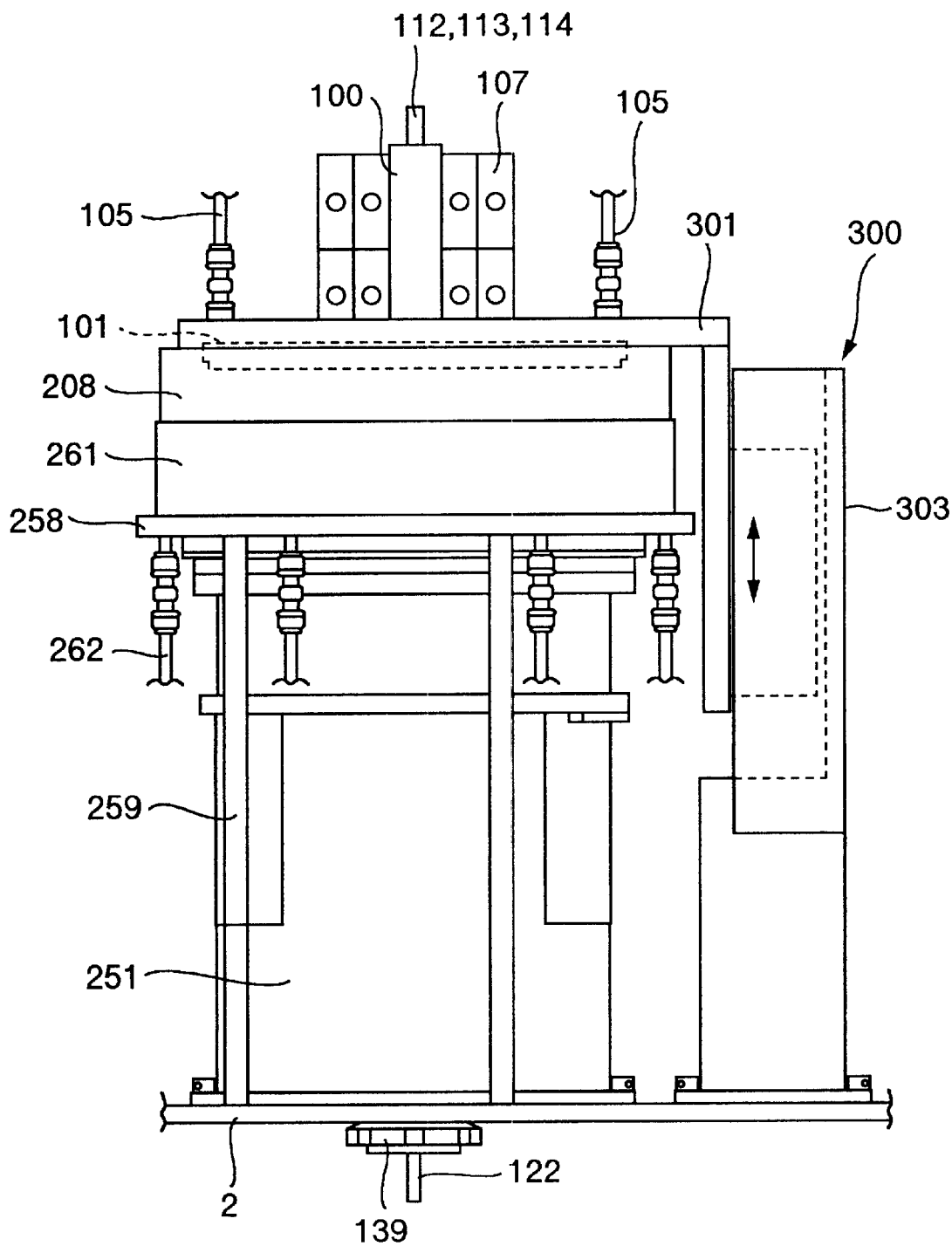
FIG. 16 is a side view of the cleaning apparatus as one embodiment of the present invention.

The gas-liquid recovery unit 260, as shown in FIGS. 7 and 9, has a cylindrical conduit,261 connected relatively rotatable to the outer wheel hood 206 and a plurality of gas-liquid recovery pipes 262 connected to this conduit 261. The cylindrical conduit 261 has its upper end formed as a sliding contact surface in a sliding contact with the outer wheel hood 208. The conduit 261 is formed with a groove extending downwardly from the upper end into which flows the waste liquid from within the outer wheel hood 208. This groove is waved so that its depth changes in the circumferential direction. The conduit 261 is connected at positions of the largest groove depth with the gas-liquid recovery pipes 262 into which the waste liquid accumulated in the groove flows. The conduit 261, as shown in FIG. 16, is secured to a pipe support fitting 258, which is fixed to the housing 2 by a plurality of stays 259. Hence, the conduit 261 and the gas-liquid recovery pipes 262 connected to the conduit do not rotate.

Figure 15:
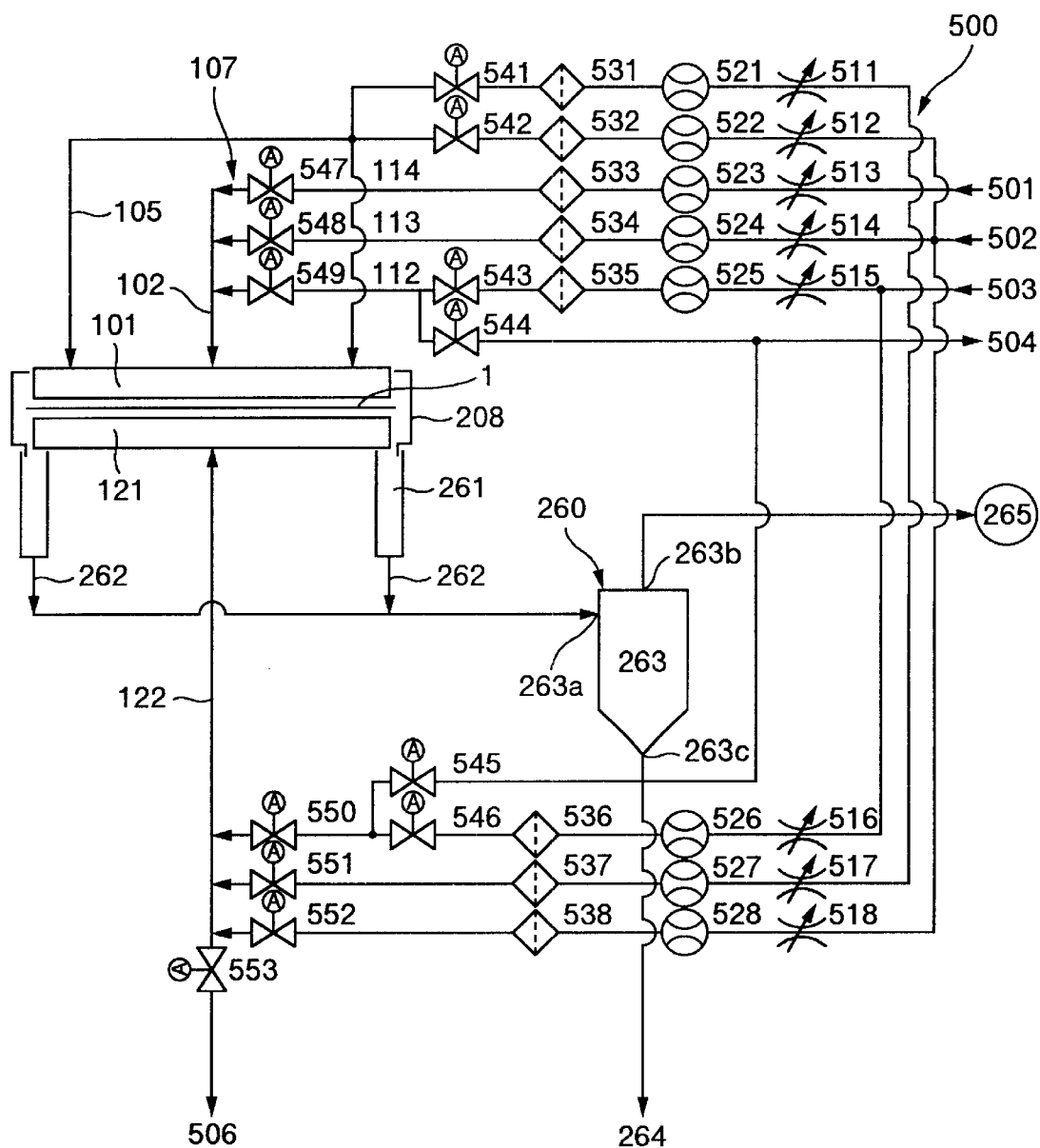
FIG. 15 is a system diagram showing a working fluid supply unit and a gas-liquid recovery unit as one embodiment of the present invention.

Further, the gas-liquid recovery unit 260 has, as shown in FIG. 15, a cyclone type gas-liquid separator 263, that separates gas and liquid contained in the waste liquid from the gas-liquid recovery pipes 262, and a vacuum pump (suction means) 265 that evacuates the gas-liquid recovery line by suction.

The cyclone type gas-liquid separator 263 has a waste liquid inlet 263*a*, a gas exhaust outlet 263*b* and a waste liquid discharge outlet 263*c*. The waste liquid inlet 263*a* is connected with a plurality of gas-liquid recovery pipes 262 which are unified into a single pipe. The gas exhaust outlet 263*b* is connected to the vacuum pump 265 and the waste liquid discharge outlet 263*c* is connected with a waste liquid discharge line 264, which in turn is connected to a waste liquid treatment facility not shown.

The working fluid supply unit 500, as shown in FIG. 15, has a dry nitrogen supply system for supplying dry nitrogen from a dry nitrogen supply unit 501, a pure water supply system for supplying pure water from a pure water supply unit 502, a chemical liquid supply system for supplying a chemical liquid from a chemical liquid supply unit 503, and a chemical liquid recovery system for returning the chemical liquid from the chemical liquid supply system to a chemical liquid recovery unit 504.

The dry nitrogen supply system and the pure water supply system are each divided into three subsystems—an upper cleaning plate central supply subsystem, an upper cleaning plate peripheral supply subsystem, and a lower cleaning plate supply subsystem. The three subsystems of the dry nitrogen supply system are each provided with a throttle valve 551, 513, 517, a flow meter 521, 523, 527, a filter 531, 533, 537 and a pneumatic sluice valve 541, 547, 551. The three subsystems of the pure water supply system are also provided with a throttle valve 512, 514, 518, a flow meter 522, 524, 528, a filter 532, 534, 538 and a pneumatic sluice valve 542, 548, 552.

The chemical liquid supply system is divided into two subsystems—an upper cleaning plate central supply subsystem and a lower cleaning plate supply subsystem. The two subsystems of the chemical liquid supply system are each provided with a throttle valve 515, 516, a flow meter 525, 526, a filter 535, 536, a first pneumatic sluice valve 543, 546 and a second pneumatic sluice valve 549, 550.

The chemical liquid recovery system comprises two subsystems. One of the two subsystems is an upper chemical liquid recovery subsystem branching from between the first pneumatic sluice valve 543 and the second pneumatic sluice valve 549 of the upper cleaning plate central supply subsystem of the chemical liquid supply system. Another subsystem is a lower chemical liquid recovery subsystem branching from between the first pneumatic sluice valve 546 and the second pneumatic sluice valve 550 of the lower cleaning plate supply subsystem of the chemical liquid supply system. The two subsystems of the chemical liquid recovery system are each provided with a pneumatic sluice valve 544, 545.

The three pneumatic sluice valves 547, 548, 549 of the upper cleaning plate central supply subsystem are connected to the upper introduction pipe 102 of the upper cleaning unit 100. The two pneumatic sluice valves 541, 542 of the upper cleaning plate peripheral supply subsystem are connected to the upper peripheral introduction pipes 105 of the upper cleaning unit 100. The three pneumatic sluice valves 547, 548, 549 of the upper cleaning plate central supply subsystem make up the valve unit 107 of the upper cleaning unit 100. The three pneumatic sluice valves 550, 551, 552 of the lower cleaning plate supply subsystem are connected to the lower introduction pipe 122 of the lower cleaning unit 120. Because the three pneumatic sluice valves 550, 551, 552 of the lower cleaning plate supply subsystem cannot be mounted directly on the upper cleaning plate 101 as in the valve unit 107 (547, 548, 549) of the upper cleaning unit 100, the lower introduction pipe 122 becomes necessarily long. Hence, after the gas-liquid switching has been made, the fluid used before the gas-liquid switching-remains in the lower introduction pipe 122 in large amounts. Therefore, in this embodiment, to remove the residual fluid in the lower introduction pipe 122, the lower introduction pipe 122 is provided, through the pneumatic sluice valve 553, with a suck-back line 506.

Figure 13:
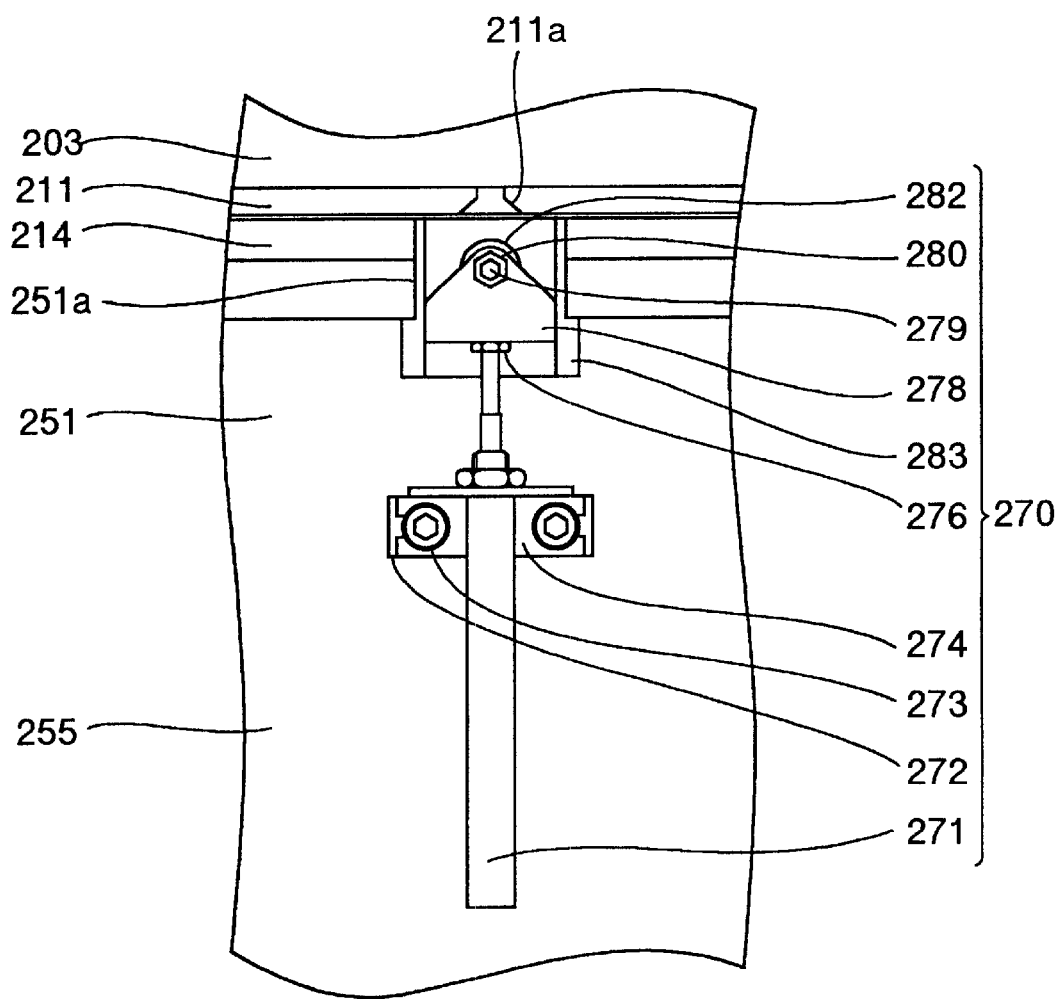
FIG. 13 is a front view of an outer wheel stopping unit as one embodiment of the present invention.
Figure 14:
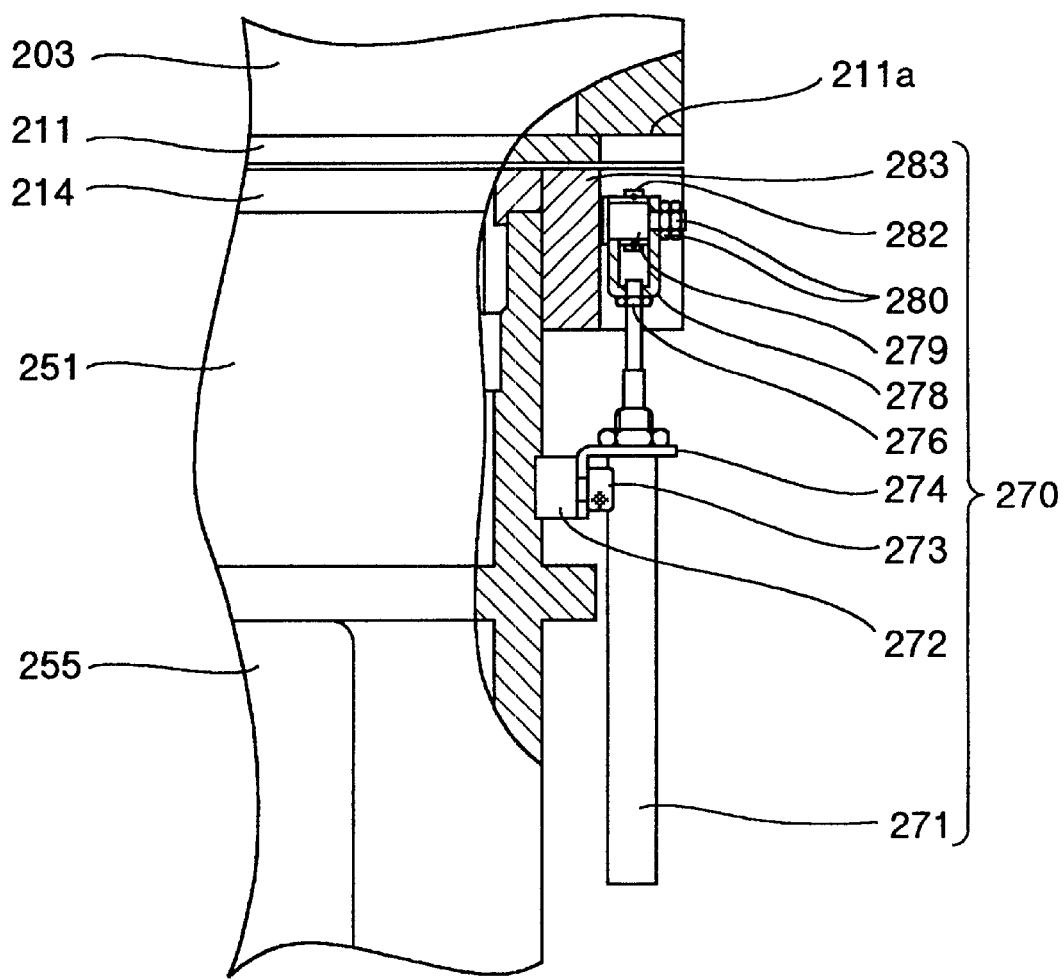
FIG. 14 is a side view, partly cut away, of the outer wheel stopping unit as one embodiment of the present invention.

The outer wheel stopping unit 270, as shown in FIGS. 13 and 14, has an air cylinder 271. A cylinder case of the air cylinder 271 is secured to the outer circumferential surface of the chassis 251 with a spacer 272, an angle 274 and a screw 273.

The front end of the cylinder rod of the air cylinder 271 is fitted with a brake head cover 278 and fastened by a screw 276. The brake head cover 278 is attached with a cylindrical brake head 282 and fastened by a shaft 279 and a screw 280. The outer circumference of the upper part of the chassis 251 is formed with a groove 251a, which is securely attached with a guide 283 that guides the vertical motion of the brake head cover 278. The outer periphery of the flange portion of the outer wheel holding hollow shaft 211 is formed with a groove 211a that receives the brake head 282. While the outer wheel 203 and the outer wheel holding hollow shaft 211 are rotating, the driving of the air cylinder 271 to fit the brake head 282 into the groove 211a of the outer wheel holding hollow shaft 211 stops their rotation.

The vertical drive unit 300, as shown in FIG. 16, has a cleaning plate fixing beam 301, to which the upper cleaning plate 101 of the upper cleaning unit 100 is secured, and a vertical drive table 303 for vertically moving the upper cleaning unit 100 along with the cleaning plate fixing beam 301. The vertical drive table 303 is rigidly secured to the housing 2.

In the construction described above, a chuck member spinning mechanism comprises the inner wheel 204, outer wheel 203, inner wheel drive system 230, outer wheel holding hollow shaft 211 and lower bearing inner race holding member 216. A chuck member revolving member comprises the inner wheel 204, outer wheel 203, inner wheel holding hollow shaft 231, cam follower 232 and outer wheel drive system 210. A relative rotation means forming a part of the chuck member spinning mechanism includes the inner wheel drive system 230, outer wheel holding hollow shaft 211 and lower bearing inner race holding member 216. A integral rotation means has the inner wheel holding hollow shaft 231, cam follower 232 and outer wheel drive system 210. Of the members making up the relative rotation means and the integral rotation means, the cam follower 232 of the inner wheel drive system 230 and the cam groove 222 formed in the lower bearing inner race holding member 216 of the outer wheel drive system 210 have important roles in the relative rotation of the inner wheel 204 relative to the outer wheel 203 and in the integral rotation of the outer wheel 203 and the inner wheel 204.

Next, the operation of the cleaning apparatus with the above construction will be described.

In the standby state before cleaning the wafer 1, as shown in FIGS. 7 and 9, the upper cleaning unit 100 is situated at the uppermost position and thus greatly separated from the lower cleaning unit 120. The cam follower 232 attached to the inner wheel holding hollow shaft 231, as shown in FIG. 12(a), is situated at the standby position 222a of the cam groove 222 formed in the lower bearing inner race holding member 216 at the lower end of the outer wheel holding hollow shaft 211. The inner wheel holding hollow shaft 231, the inner wheel 204 and the chuck pins 201 are situated at an intermediate level in the vertical direction. The driving end of the vertical drive cylinder 242 of the inner wheel drive system 230, the upper and lower rings 239, 240 connected to the driving end, and the geared rotating disk 234 fixed to the lower end of the inner wheel holding hollow shaft 231 and sandwiched between the upper and lower rings 239, 240 are also situated at an intermediate level in the vertical direction. The geared rotating disk 234 and the clutch gear 235 are engaged. The cylinder rod of the air cylinder 271 of the outer wheel stopping unit 270 (FIGS. 13 and 14) is extended upwardly, with the brake head 282 attached to the front end of the cylinder rod engaged in the groove 211a of the outer wheel holding hollow shaft 211. Thus, the outer wheel holding hollow shaft 211 and the outer wheel 203 secured to it are held unrotatable at their initial positions.

Next, from the above standby state the driving end of the vertical drive cylinder 242 of the inner wheel drive system 230 is raised to assume the wafer chuck wait state, as shown in FIGS. 7 to 10. As the driving end of the vertical drive cylinder 242 of the inner wheel drive system 230 is raised, the upper and lower rings 239, 240 connected to the driving end, the geared rotating disk 234 held between the upper and lower rings 239, 240, the inner wheel holding hollow shaft 231 having the geared rotating disk 234 secured to the lower end thereof, the cam follower 232 and inner wheel 204 mounted to the inner wheel holding hollow shaft 231, and the chuck pins 201 held vertically immovable relative to the inner wheel 204 are also raised to reach their uppermost positions. At this time, the cam follower 232, as shown in FIG. 12(b), is situated at the wafer chuck wait position 222b, the uppermost position of the cam groove 222, and can no longer move further up. Hence, the inner wheel holding hollow shaft 231 and the inner wheel 204 secured to it, too, cannot move up any further. In the wafer chuck wait state the upper end of the chuck pins 201 projects above the upper end of the outer wheel hood 208. The wafer release portion 201*b* formed at the upper end of the chuck pins 201 is directed toward the support shaft 138, as shown in FIG. 7, so that the wafer 1 can be mounted to the chuck pins 201. The geared rotating disk 234 and the clutch gear 235 are engaged as in the standby state, as shown in FIG. 8, so that starting the inner wheel motor 237 can rotate the inner wheel holding hollow shaft 231 to which the geared rotating disk 234 is secured and the inner wheel 204.

In the wafer chuck wait state, the wafer 1 is placed on the wafer release portions 201*b* of a plurality of the chuck pins 201.

With the wafer 1 put on the wafer release portions 201*b* of the chuck pins 201, the inner wheel motor 237 is started to chuck the wafer. Because the geared rotating disk 234 and the clutch gear 235 are engaged as described earlier, the starting of the inner wheel motor 237 causes the geared rotating disk 234, the inner wheel holding hollow shaft 231, to which the geared rotating disk 234 is secured, and the inner wheel 204 secured to the inner wheel holding hollow shaft 231 to rotate about the support shaft 138. The outer wheel 203 is held unrotatable by the outer wheel stopping unit 270, so that the inner wheel 204 rotates relative to the outer wheel 203. As the inner wheel 204 rotates relative to the outer wheel 203, the chuck pins 201 disposed between the inner wheel 204 and the outer wheel 203 spin on their own axes, as shown in FIG. 11, directing the chuck groove 201*a* formed on the upper end of the chuck pins 201 toward the support shaft 138, with the result that outer periphery of the wafer 1 simply supported on the wafer release portions 201*b* of the chuck pins 201 fits into the chuck grooves 201*a*. The chuck pins 201 have rotated on their axes through 90 degrees.

Now, the cam follower 232 is situated at the wafer chuck position 222*c* of the cam groove 222 as shown in FIG. 12(*c*), and can no longer move further away from the wafer chuck wait position 222*b*. The distance that the cam follower 232 travels from the wafer chuck wait position 222*b* to the wafer chuck position 222*c*, i.e., the relative rotation of the inner wheel holding hollow shaft 231 with respect to the outer wheel holding hollow shaft 211, corresponds to the 90-degree spin of the chuck pins 201. In other words, the 90-degree spin of the chuck pins 201 is restricted by the distance from the wafer chuck wait position 222*b* to the wafer chuck position 222*c* of the cam groove 222.

With the wafer 1 chucked by the chuck pins 201, the driving end of the vertical drive cylinder 242 of the inner wheel drive system 230 is lowered. As the driving end of the vertical drive cylinder 242 of the inner wheel drive system 230 is lowered, the upper and lower rings 239, 240 connected to the driving end of the vertical drive cylinder 242, the geared rotating disk 234 held between the upper and lower rings 239, 240, the inner wheel holding hollow shaft 231 having the geared rotating disk 234 secured to the lower end thereof, the cam follower 232 and inner wheel 204 mounted to the inner wheel holding hollow shaft 231, and the chuck pins 201 held vertically immovable relative to the inner wheel 204 are also lowered to reach their lowermost positions, as shown in FIGS. 3 to 6. During this process, the wafer 1 chucked by the chuck pins 201 is also lowered coming close to the lower cleaning plate of the lower cleaning unit 120. When the chuck pins 201 and others reach their lowermost positions, the cam follower 232 is situated at the cleaning position 222*d*, the lowest end of the cam groove 222, as shown in FIG. 12(*d*), and cannot move down any further.

Thus, the inner wheel holding hollow shaft 231 having the cam follower 232 secured thereto, the inner wheel 204 secured to the inner wheel holding hollow shaft 231, and the chuck pins 201 cannot move down any further. Because the cam groove 222 extends only upwardly from the cleaning position 222*d*, the cam follower 232 situated at the cleaning position 222*d* cannot move horizontally in the cam groove 222. Hence, the inner wheel holding hollow shaft 231 to which the cam follower 232 is mounted cannot rotate relative to the lower bearing inner race holding member 216, in which the cam groove 222 is formed, and the outer wheel holding hollow shaft 211, to which the lower bearing inner race holding member 216 is secured. Therefore, when the outer wheel rotation hollow motor 219 is started, not only the outer wheel holding hollow shaft 211 but also the inner wheel holding hollow shaft 231 are rotated. In this state, the geared rotating disk 234 and the clutch gear 235 are disengaged as shown in FIG. 4 and therefore starting the inner wheel motor 237 cannot rotate the geared rotating disk 234, the inner wheel holding hollow shaft 231 to which the geared rotating disk 234 is secured, and the inner wheel 204.

Next, the vertical drive table 303 of the vertical drive unit 300 is driven to lower the upper cleaning plate 101 of the upper cleaning unit 100 to bring the upper cleaning plate 101 close to the wafer 1 chucked by the chuck pins 201. Now, the apparatus is in the cleaning state. At this time, as shown in FIG. 17, the bottom surface of the upper cleaning plate 101, the wafer 1 and the top surface of the lower cleaning plate 121 are horizontal and facing one another. The distance S between the bottom surface of the upper cleaning plate 101 and the upper surface of the wafer 1 and the distance S between the top surface of the lower cleaning plate 121 and the lower surface of the wafer 1 are both approximately 0.6 mm.

In the cleaning state, the chemical liquid, pure water and dry nitrogen are supplied successively from the chemical liquid supply unit 503, the pure water supply unit 502 and the dry nitrogen supply unit 501 through the working fluid supply unit 500 shown in FIG. 15 to the upper and lower cleaning units 100, 120. At the same time, the air cylinder 271 of the outer wheel stopping unit 270 is driven to release the outer wheel 203 and then the outer wheel rotation hollow motor 219 is started. When the outer wheel rotation hollow motor 219 is activated, the outer wheel holding hollow shaft 211 and the inner wheel holding hollow shaft 231 are rotated together as described earlier. This rotation causes the inner wheel 204 and the outer wheel 203 to rotate together about the support shaft 138, with the result that the chuck pins 201 disposed between the inner wheel 204 and the outer wheel 203 revolve around the support shaft 138. Therefore, the wafer 1 chucked by the chuck pins 201 is also rotated about the support shaft 138.

The working fluid supplied to the upper cleaning plate 101 is ejected from the upper main nozzle 103 and the upper auxiliary nozzles 104 of the upper cleaning plate 101, as shown in FIG. 17, and flows between the bottom surface of the upper cleaning plate 101 and the upper surface of the wafer 1 toward the outer periphery of the wafer 1. The working fluid supplied to the lower cleaning plate 121 is ejected from the lower main nozzle 123 and the lower auxiliary nozzles 124 of the lower cleaning plate 121 and flows between the top surface of the lower cleaning plate 121 and the lower surface of the wafer 1 toward the outer periphery of the wafer 1. The working fluids flowing between the upper cleaning plate 101 and the upper surface of the wafer 1 and between the lower cleaning plate 121 and the lower surface of the wafer 1 generate pressures in respective spaces according to the Bernoulli theorem. The pressure developed between the upper cleaning plate 101 and the upper surface of the wafer 1 and the pressure developed between the lower cleaning plate 121 and the lower surface of the wafer 1 are basically equal and there is a subtle pressure balance between them.

The flow of working fluid supplied to the upper cleaning plate 101 and the flow supplied to the lower cleaning plate 121 may get out of balance slightly, as when a trouble occurs with a part of the working fluid supply unit 500 or when the working fluid supply unit 500 is operated erroneously. In such a case, the pressure between the upper cleaning plate 101 and the upper surface of the wafer 1 and the pressure between the lower cleaning plate 121 and the lower surface of the wafer 1 will become unbalanced, with the result that the wafer 1 tends to tilt or move vertically between the upper cleaning plate 101 and the lower cleaning plate 121. However, because it is firmly chucked by the plurality of chuck pins 201, the wafer 1 will not incline or vertically move. It is therefore possible to avoid wafer damage or smear that would be caused by tilting or vertical displacement.

The working fluid flowing between the upper cleaning plate 101 and the upper surface of the wafer 1 toward the outer periphery of the wafer 1 and the working fluid flowing between the lower cleaning plate 121 and the under surface of the wafer 1 toward the outer periphery of the wafer 1 are arrested by the outer wheel hood (enclosure member) 208 situated on the outer side of the wafer 1, from which the working fluids flow into the conduit 261 of the gas-liquid recovery unit 260 indirectly fixed to the housing 2. From the conduit 261 the fluids flow through the gas-liquid recovery pipes 262 into the cyclone type gas-liquid separator 263 shown in FIG. 15, where gas such as nitrogen is separated from liquid, with the gas exhausted through the vacuum pump 265 and the liquids such as chemical liquid and pure water delivered through the waste liquid discharge line 264 to a waste liquid treatment facility not shown.

In this embodiment, when the cleaned wafer 1 is dried by using the dry nitrogen, the wafer 1 is rotated at a higher speed than when it is cleaned using chemical liquid or pure water. This is to remove water adhering to the wafer 1 as quickly as possible. During the drying process, the distance S between the bottom surface of the upper cleaning plate 101 and the upper surface of the wafer 1 is set at 3 mm. In the cleaning and drying processes, the space enclosed by the upper cleaning plate 101, the lower cleaning plate 121 and the outer wheel hood 208, in which the wafer 1 is placed, is evacuated by the vacuum pump 265, so it is possible to discharge the liquid from this space quickly and efficiently, avoid backflow of the working fluid and thereby prevent contamination of the wafer 1. Further, when, after the cleaning and drying processes are completed, the upper cleaning unit 100 is raised to take out the wafer 1 from between the upper cleaning plate 101 and the lower cleaning plate 121, because the working fluid in the space enclosed by the upper cleaning plate 101, the lower cleaning plate 121 and the outer wheel hood 208 is almost completely discharged, the wafer 1 can be prevented from being contaminated by the residual working fluid adhering to the wafer again.

When the wafer cleaning and drying processes are finished, the outer wheel rotation hollow motor 219 is stopped and the air cylinder 271 of the outer wheel stopping unit 270 is driven to restrain the outer wheel 203 unrotatable. At the same time, the vertical drive table 303 is driven to retract the upper cleaning unit 100 upwardly. Next, the driving end of the vertical drive cylinder 242 is raised. Now the apparatus is in the wafer chuck state. Then, the inner wheel motor 237 is activated to bring the apparatus into the wafer chuck wait state to unchuck the wafer 1 from the chuck pins 201. Finally, the driving end of the vertical drive cylinder 242 of the inner wheel drive system 230 is lowered to assume the standby state.

Although in the above embodiment the cam follower 232 is provided on the side of the inner wheel holding hollow shaft 231 and the cam groove 222 is provided on the side of the outer wheel holding hollow shaft 211, it is possible to provide the cam follower 232 on the outer wheel holding hollow shaft 211 side and the cam groove 222 on the inner wheel holding hollow shaft 231 side.

Further, while the above embodiment uses the motor 237 with a clutch mechanism as the source for driving the inner wheel 204, a hollow motor like the outer wheel rotation hollow motor 219 of the outer wheel drive system 210 may be used. In that case, the rotor of the hollow motor is secured to the inner wheel holding hollow shaft 231 and the stator to the chassis 251, so that the vertical motion of the inner wheel 204 and the inner wheel holding hollow shaft 231 causes the rotor to project from and retract into the stator. In more concrete terms, in the cleaning state of FIG. 12(*d*), the rotor of the hollow motor projects from the stator preventing the hollow motor from generating the driving force. In the chuck wait state of FIG. 12(*b*) and in the chuck state of FIG. 12(*c*), the rotor of the hollow motor retracts completely into the stator to allow the hollow motor to generate the driving force. This arrangement dispenses with the need for the geared clutch, reducing the amount of dust produced and eliminating the operation failure due to the clutch engagement failure, which in turn enhances the reliability of the operation.

In the above embodiment, the arc grooves 202 are formed in the inner circumferential surface of the outer wheel 203 and the outer circumferential surface of the inner wheel 204 is formed with the gear 205 to spin the chuck pins 201 on their own axes and also revolve them around the support shaft 138. The spinning and revolving of the chuck pins 201 can also be realized by a deformed Geneva cam.

Figure 18:
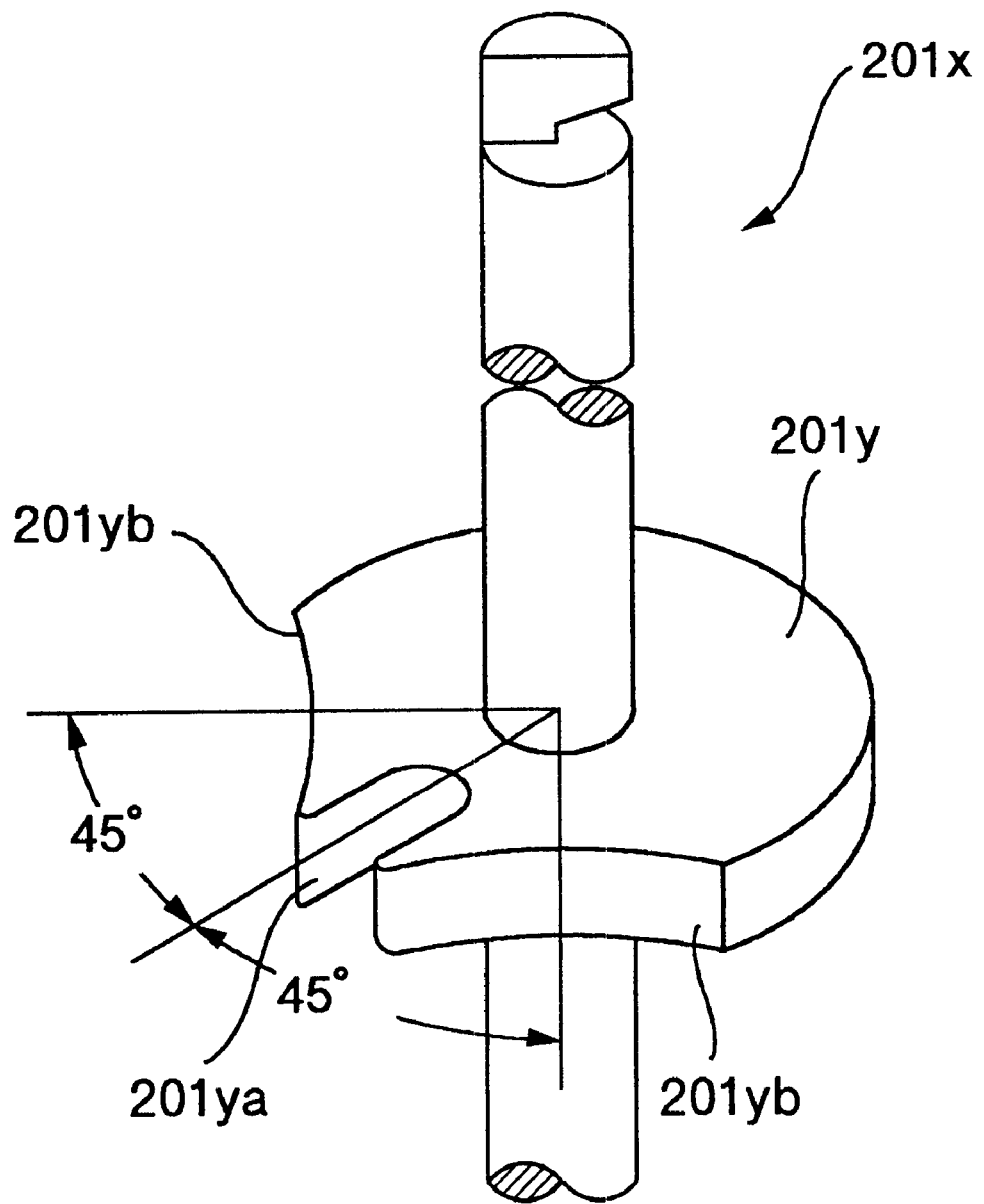
FIG. 18 is a perspective view of a chuck pin as another embodiment of the present invention.
Figure 19:
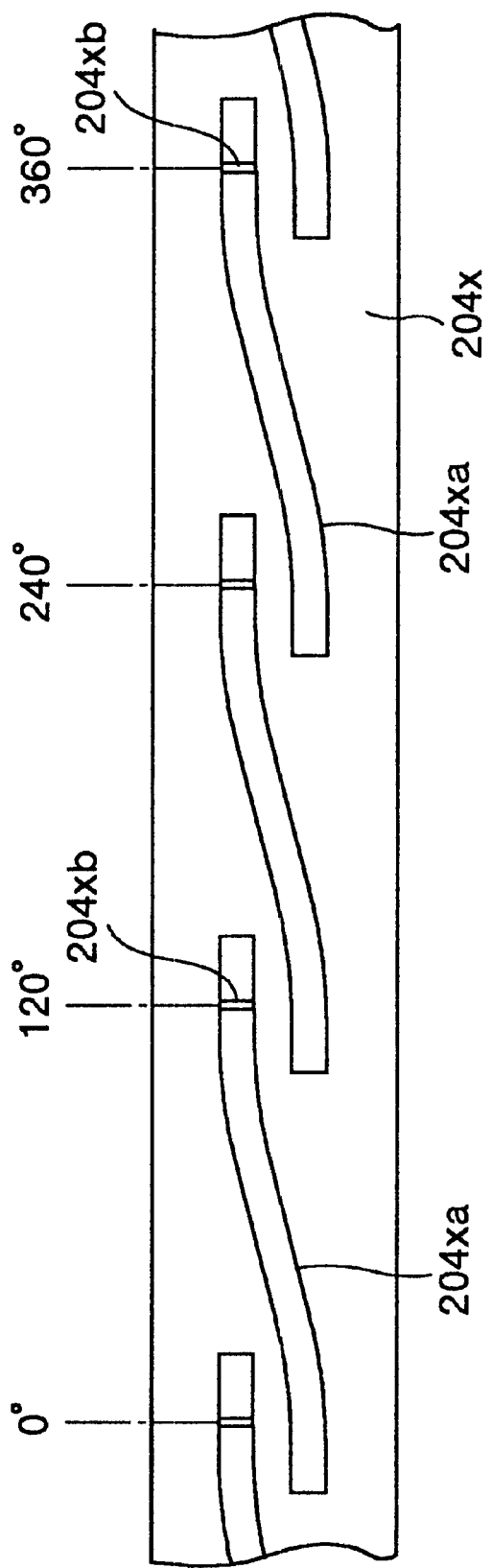
FIG. 19 is a development of an inner wheel as another embodiment of the present invention.
Figure 20:
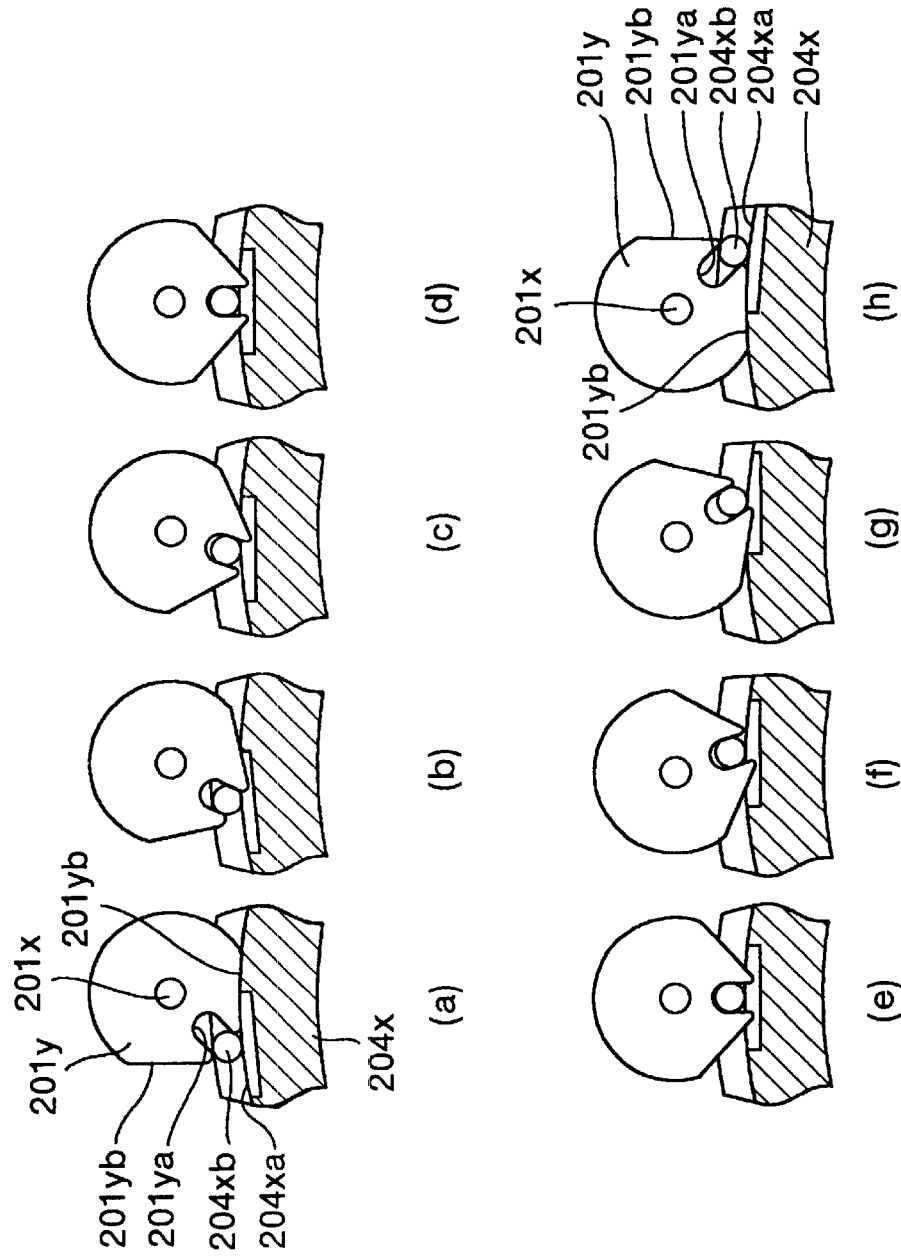
FIG. 20 is an explanatory view showing the operation of a chuck pin as one embodiment of the present invention.

To describe in more detail, an inner wheel 204*x* is formed at its outer circumference with a groove 204*xa*, which is provided with a cam pin 204*xb*, as shown in FIGS. 19 and 20. A chuck pin 201*x*, as shown in FIGS. 19 and 20, has a disk-like blade (cam follower) 201*y*, as shown in FIGS. 18 and 20. The cam follower 201*y* is formed with a groove 201*ya* recessed from the outer circumference toward the center axis to receive the cam pin 204*xb* and with rotation restriction surfaces 20l*yb*, 20l*yb* at center positions ±45 degrees from the groove 201*ya* which are shaped to match the outer diameter of the bottom of the groove 204*xa* of the inner wheel 204*x*. The chuck pins 201*x* are mounted to the outer wheel so that they can revolve around the support shaft 138 together with the outer wheel and can spin their own axes.

In this variation example, in the chuck wait state one on restriction surfaces 201*yb* of the blade 201*y* is in contact with the bottom of the groove 204*xa* of the inner wheel 204*x*, as shown in FIG. 20(*a*). In this chuck wait state, when only the inner wheel 204*x* is rotated while holding the outer wheel stationary, the groove 201*ya* of the blade 201*y* contacts the cam pin 204*xb* of the inner wheel 204*x*, causing the chuck pin 201*x* to spin on its axis as shown in FIGS. 20(*b*)–20(*g*) until the chuck pin 201*x* eventually spins 90 degrees from the chuck wait state bringing the other rotation restriction surface 201*yb* of the blade 201*y* into contact with the bottom of the groove 204*xa* of the inner wheel 204*x*, as shown in FIG. 20(h) at which time the spin of the chuck pin stops and the chuck state is reached. When the wafer chucked by the chuck pins 201x is to be rotated, the inner wheel and the outer wheel are rotated together as in the previous embodiment to rotate the chuck pins 201 around the support shaft 138.

As described above, the use of the deformed Geneva cam can increase strength, simplify the shape and reduce cost, compared with the gear structure. Further, with the Geneva cam the maximum spin angle of the chuck pin (90 degrees) does not depend on the relative rotation angle between the inner wheel and the outer wheel but depends on the angle between the two rotation restriction surfaces 201yb, 2091yb (90 degrees) lying on both sides of the center axis of the blade 201y. Hence, there is no need to enhance very high the precision of the relative rotation angle of the inner wheel with respect to the outer wheel.

If, as shown in FIG. 19, the cam groove 204xa formed in the outer circumference of the inner wheel 204x is extended diagonally downward from the position of the cam pin 204xb, the relative rotation of the inner wheel 204x with respect to the outer wheel causes the chuck pin 201x attached to the outer wheel to move vertically. Vertically moving the chuck pin 201x through the relative rotation of the inner wheel with respect to the outer wheel obviates the need for the vertical drive cylinder 242 of the inner wheel drive system 230, reducing the manufacturing cost.

Figure 21:
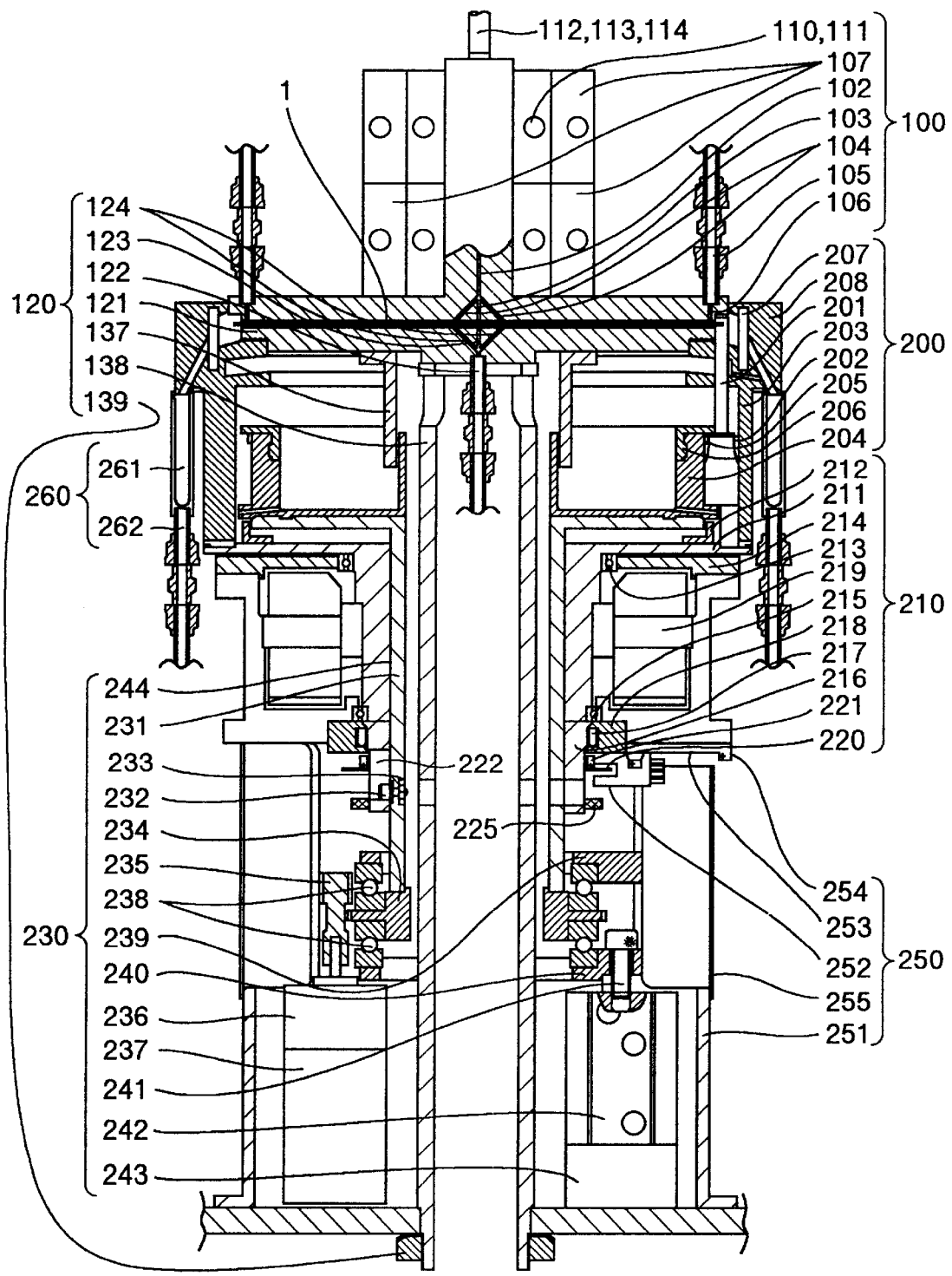
FIG. 21 is a vertical cross section of a fluid-treatment apparatus as one embodiment of the present invention.
Figure 22:
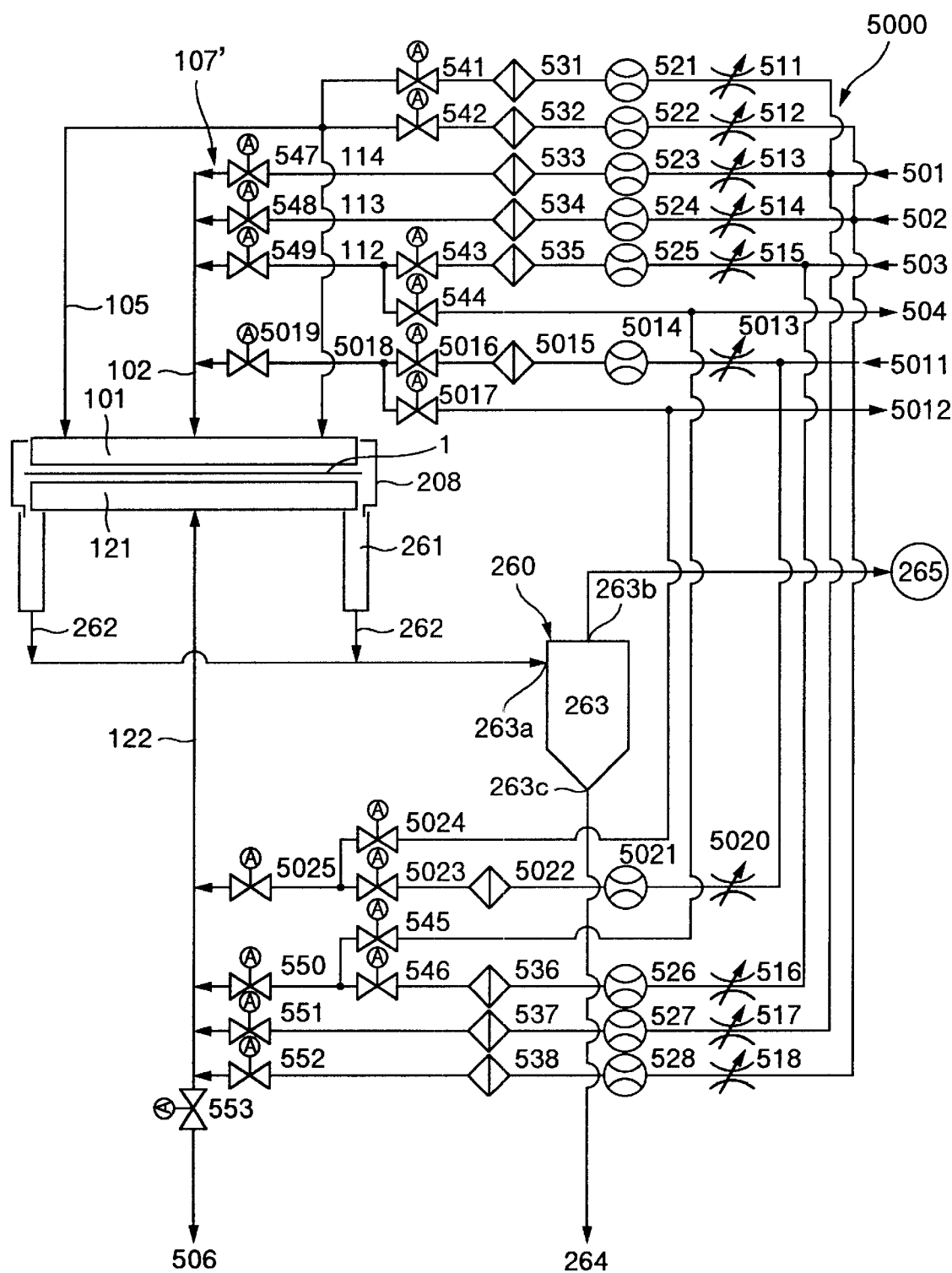
FIG. 22 is a system diagram showing a working fluid supply unit and a gas-liquid recovery unit as one embodiment of the present invention.

Although the embodiment has been described in which the fluid treatment is cleaning, we will explain about an embodiment of the fluid-treatment apparatus that includes a plating function by referring to FIGS. 21 and 22.

FIG. 21 shows a head portion of the fluid-treatment apparatus of another embodiment. Unlike the first embodiment, the outer wheel drive system 210' includes a feeder brush 225. Further, the outer wheel holding hollow shaft 211 and the chuck pins 201 are made of an electricity conductive stainless steel material; the upper cleaning plate 101 and/or the lower cleaning plate 121 are made of an electricity conductive material, such as carbon, stainless steel and copper; and the outer wheel hood 208 is made of an insulating resin material.

If the upper cleaning plate 101 or the lower cleaning plate 121 is used as an anode and the chuck pins 201 as cathode through the feeder brush 225, the plate-like part held by the chuck pins 201 becomes a cathode. If a plating liquid is used as the working fluid and flowed between the upper cleaning plate 101 or lower cleaning plate 121 and the plate-like part and electricity is applied, the surface of the plate-like part is plated.

FIG. 22 shows a working fluid supply unit 5000 for supplying and recovering the plating liquid. The working fluid supply unit 5000 has a plating liquid supply system and a plating liquid recovery system added to the working fluid supply unit 500 of the first embodiment of FIG. 15 that performs the cleaning as the fluid treatment. The plating liquid supply system is to supply a plating liquid from a plating liquid supply unit 5011 and the plating liquid recovery system is to return the plating liquid in the plating liquid supply system to a plating liquid recovery unit 5012. Hence, the apparatus of this embodiment can perform the cleaning operation as well as the plating operation. The plating liquid supply system is divided into two subsystems, an upper cleaning plate central supply subsystem and a lower cleaning plate central supply subsystem. The two subsystems of the plating liquid supply system each have a throttle valve 5013, 5020, a flow meter 5014, 5021, a filter 5015, 5022, a first pneumatic sluice valve 5016, 5023, and a second pneumatic sluice valve 5019, 5025.

The plating liquid recovery system has two subsystems, an upper plating liquid recovery subsystem and a lower plating liquid recovery subsystem. The upper plating liquid recovery subsystem branches,from between the first pneumatic sluice valve 5016 and the second pneumatic sluice valve 5019 in the upper cleaning plate central supply subsystem of the plating liquid supply system. The lower plating liquid recovery subsystem branches from between the first pneumatic sluice valve 5023 and the second pneumatic sluice valve 5025 in the lower cleaning plate central supply subsystem of the plating liquid supply system. The two subsystems of the plating liquid recovery system are each provided with pneumatic sluice valves 5017, 5024.

The second pneumatic sluice valve 5019 of the upper cleaning plate central supply subsystem is connected to the upper introduction pipe 102 of the upper cleaning unit 100. The three pneumatic sluice valves 547, 548, 549, 5019 in the upper cleaning plate central supply subsystem make up the valve unit 107' of the upper cleaning unit 100. The second pneumatic sluice valve 5025 of the lower cleaning plate supply subsystem is connected to the lower introduction pipe 122 of the lower cleaning unit 120.

In this embodiment, because the plating processing, the cleaning processing and the drying processing can be performed on the plate-like member continuously in one sequence, a plating and cleaning apparatus can be realized which can dispose of the waste liquid from the plating processing without splashing it, thus posing very little risk of environmental pollution. In the semiconductor wafer plating processing, in particular, because the cleaning operation as part of the passivation processing can be carried out continuously in one sequence while shielding a very thin wiring layer from external oxygen, it is possible to complete the processing without forming an oxide film over the surface of the wiring layer and therefore provide a high quality wiring layer easily.

Industrial Applicabilty

According to the present invention, because the outer periphery of the plate-like part can be chucked firmly by a plurality of chuck members formed with a chuck groove, the plate-like part, when it is rotated during the fluid-treatment, can be prevented from tilting or moving, thereby protecting the plate-like part against damages or contamination caused by tiling or moving. Further, according to another invention in this application, because the outer periphery of the plate-like part is enclosed by the enclosure member and the interior of the enclosure member is evacuated by a suction means, the waste liquid can be prevented from flowing back during the fluid treatment operation and, after the fluid treatment, no mist of the waste liquid remains inside the enclosure member, thus eliminating the possibility of the residual waste liquid within the enclosure member adhering again to the plate-like part. Hence, the plate-like part can be protected against contamination from the waste liquid. These inventions therefore are very suited for the fluid treatment of plate-like parts.

What is claimed is:

1. A fluid-treatment apparatus for plate-like parts, in which a fluid-treatment plate faces parallelly at least one of two almost parallel surfaces of a plate-like part and a treatment fluid is ejected from the fluid-treatment plate onto the one surface of the plate-like part while rotating the plate-like part to fluid-treat the one surface of the plate-like part, the fluid-treatment apparatus comprising:

a plurality of chuck members each having a chuck groove into which an outer periphery of the plate-like part fits, the chuck members being spun on their own axes to assume two states, one of the two states being a chuck state in which the outer periphery of the plate-like part fits in the chuck grooves of the chuck members, the other being a chuck wait state in which the outer periphery of the plate-like part is disengaged from the chuck grooves;

a chuck member spin mechanism to spin the plurality of chuck members on their own axes to bring all the chuck members as one piece into the chuck state and the chuck wait state; and a chuck member revolution mechanism to revolve the plurality of chuck members as one piece about an axis to spin the plate-like part chucked by the plurality of chuck members on its own axis.

2. A fluid-treatment apparatus for plate-like parts according to claim 1, further including a chuck member moving mechanism to move the plurality of chuck members in a direction parallel to a revolving axis of the plurality of chuck members.

3. A fluid-treatment apparatus for plate-like parts according to claim 1, further including:

an inner wheel formed cylindrical and having as its center the revolution axis of the plurality of chuck members;

an outer wheel formed cylindrical and having as its center the revolution axis, the outer wheel having an inner diameter larger than an outer diameter of the inner wheel;

a relative rotation means to rotate the inner wheel relative to the outer wheel about the revolution axis; and an integral rotation means to rotate the outer wheel and the inner wheel together about the revolution axis;

wherein the plurality of chuck members engage the outer wheel and the inner wheel so that they spin on their own axes by the relative rotation between the outer wheel and the inner wheel and revolve about a center by the integral rotation of the outer wheel and the inner wheel;

wherein the chuck member spin mechanism comprises the inner wheel, the outer wheel and the relative rotation means;

wherein the chuck member revolution mechanism comprises the inner wheel, the outer wheel and the integral rotation means.

4. A fluid-treatment apparatus for plate-like parts according to claim 3, wherein one of the inner wheel and the outer wheel is disposed to be movable in a direction parallel to the revolution axis, the plurality of chuck members engage the one of the wheels so that they cannot move relative to the one wheel in a direction parallel to the revolution axis, and a chuck member moving mechanism is provided to move the one wheel in a direction parallel to the revolution axis.

5. A fluid-treatment apparatus for plate-like parts according to claim 3, wherein one of the inner wheel and the outer wheel is formed in its circumferential surface with a cam groove, the cam groove extending progressively toward a direction parallel to the revolution axis as it advances around the revolution axis, and the chuck members are each formed with a cam follower portion that fits into the cam groove;

wherein the chuck pins are mounted to the other of the inner wheel and the outer wheel so that the chuck members rotate together with the other wheel.

6. A fluid-treatment apparatus for plate-like parts according to claim 3 or 4, wherein the chuck members have a gear formed on each of their surfaces around their spin axes;

wherein the inner wheel has formed in its outer circumferential surface around its revolution axis a gear engageable with the gear of the chuck members;

wherein the outer wheel has formed in its inner circumferential surface arc grooves each of which can accommodate a part of the gear of each of the chuck members.

7. A fluid-treatment apparatus for plate-like parts according to any one of claims 3 to 5, wherein a cam pin is secured to the circumferential surface of one of the inner wheel and the outer wheel;

wherein the chuck pins each have a cam follower portion, the cam follower portion having a groove into which the cam pin can fit and rotation restriction surfaces on both sides of the groove which are formed in a reversed shape of the circumferential surface of the one wheel;

wherein the chuck members are mounted to the other of the inner wheel and the outer wheel so that they can be rotated together with the other wheel and can also spin on their own axes.

8. A fluid-treatment apparatus for plate-like parts according to any one of claims 1 to 5, further comprising:

a fluid-treatment plate moving mechanism to move the fluid-treatment plate in a direction parallel to the revolution axis of the plurality of the chuck members.

9. A fluid-treatment apparatus for plate-like parts according to any one of claims 1 to 5, further including:

an enclosure member enclosing the outer periphery of the plate-like part and the outer periphery of the fluid-treatment plate to receive the treatment fluid injected between the plate-like part and the fluid-treatment plate and discharged from between the outer periphery of the plate-like part and the outer periphery of the fluid-treatment plate;

a treatment fluid recovery line to introduce the treatment fluid remaining in the enclosure member to a target location;

a gas-liquid separator having a liquid outlet, a gas outlet and a waste liquid inlet, the waste liquid inlet being connected to the treatment fluid recovery line; and a suction means connected to the gas outlet of the gas-liquid separator to evacuate by suction the interiors of the gas-liquid separator, the treatment fluid recovery line and the enclosure member.

10. A fluid-treatment apparatus for plate-like parts according to any one of claims 1 to 5, wherein the treatment fluid is one or more fluids selected from among chemical liquid, pure water, plating liquid and drying gas and used for fluid-treatment.

* * * * *